(12) United States Patent
Li et al.

(10) Patent No.: US 12,310,267 B2
(45) Date of Patent: May 20, 2025

(54) ReRAM MODULE WITH INTERMEDIATE ELECTRODE

(71) Applicant: International Business Machines Corporation, Armonk, NY (US)

(72) Inventors: Juntao Li, Cohoes, NY (US); Kangguo Cheng, Schenectady, NY (US); Kevin W. Brew, Niskayuna, NY (US); Dexin Kong, Redmond, WA (US)

(73) Assignee: International Business Machines Corporation, Armonk, NY (US)

( * ) Notice: Subject to any disclaimer, the term of this patent is extended or adjusted under 35 U.S.C. 154(b) by 936 days.

(21) Appl. No.: 17/346,358

(22) Filed: Jun. 14, 2021

(65) Prior Publication Data

US 2022/0399494 A1   Dec. 15, 2022

(51) Int. Cl.
*H10N 70/20* (2023.01)
*H10N 70/00* (2023.01)

(52) U.S. Cl.
CPC ......... *H10N 70/841* (2023.02); *H10N 70/011* (2023.02); *H10N 70/24* (2023.02); *H10N 70/823* (2023.02)

(58) Field of Classification Search
CPC .................. H10N 70/823; H10N 70/8418
See application file for complete search history.

(56) References Cited

U.S. PATENT DOCUMENTS

| | | | |
|---|---|---|---|
| 7,696,509 B2 * | 4/2010 | Lin .................. | H10N 70/8822 438/102 |
| 7,759,201 B2 | 7/2010 | Petti et al. | |
| 8,779,410 B2 | 7/2014 | Sato et al. | |
| 8,957,495 B2 | 2/2015 | Sakui | |
| 9,227,456 B2 | 1/2016 | Chien et al. | |
| 9,478,436 B1 | 10/2016 | Ban et al. | |
| 10,103,165 B2 | 10/2018 | Son et al. | |
| 10,658,583 B1 | 5/2020 | Juntao et al. | |
| 2009/0026438 A1 | 1/2009 | Lin | |
| 2014/0264248 A1 | 9/2014 | Sato | |

(Continued)

FOREIGN PATENT DOCUMENTS

| | | | |
|---|---|---|---|
| WO | 2016105673 A1 | 6/2016 | |
| WO | 2017111930 A1 | 6/2017 | |

(Continued)

OTHER PUBLICATIONS

Yue Bai et al., "Stacked 3D RRAM Array with Graphene/CNT as Edge Electrodes," Scientific Reports, Published Sep. 8, 2015, 9 pages.

(Continued)

*Primary Examiner* — Mark V Prenty
(74) *Attorney, Agent, or Firm* — Daniel M. Yeates

(57) ABSTRACT

A resistive RAM module comprises a source electrode and an intermediate electrode that is formed on the source electrode. The intermediate electrode has a closed-curve profile. The resistive RAM module also comprises a memristor element that is deposited on the intermediate electrode. The resistive RAM module also comprises a sink electrode that is in contact with the memristor element. The intermediate electrode is electrically between the source electrode and the memristor element and the memristor element is electrically between the intermediate electrode and the sink electrode.

5 Claims, 16 Drawing Sheets

(56) References Cited

U.S. PATENT DOCUMENTS

| | | |
|---|---|---|
| 2015/0236255 A1 | 8/2015 | Fest et al. |
| 2016/0181517 A1* | 6/2016 | Zhou .................... H10N 70/821 257/4 |
| 2020/0286955 A1 | 9/2020 | Cheng |

FOREIGN PATENT DOCUMENTS

| | | |
|---|---|---|
| WO | 2018004687 A1 | 1/2018 |
| WO | 2022263165 A1 | 12/2022 |

OTHER PUBLICATIONS

EP Examination Report for Application No. 22 734 165.8-1211, dated Jun. 6, 2024, 4 pages.

International Search Report and Written Opinion for International Application No. PCT/EP2022/064707, dated Nov. 2, 2022, 10 pages.

* cited by examiner

ReRAM MODULE WITH INTERMEDIATE ELECTRODE

BACKGROUND

Random access memory (referred to herein as "RAM") is a storage class used in computer storage systems. RAM comes in several forms, many of which are useful for fast access to information inside and outside a processor cache. As such, some types of RAM are installed on a system board, such as a motherboard. These types of RAM can store information in different ways, depending on the format of the RAM. Some types, for example, store a bit of information (e.g., a "1" or a "0") by varying the states of a transistor-capacitor pair in the RAM cell.

Some types of RAM store a bit of information by varying the state of the electrical resistance across the RAM cell. These resistive RAM (ReRAM) modules include a memristor element located between two electrodes. By introducing a voltage to the memristor element, a pattern of conductive defects can be created in the memristor element. This pattern is often referred to as a conductive filament and can be controlled to switch the memristor element between high- and low-resistance states.

SUMMARY

Some embodiments of the present disclosure can be illustrated as a resistive RAM module that comprises a source electrode and an intermediate electrode. The intermediate electrode is formed on the source electrode. The resistive RAM module also comprises a memristor element that is deposited on the intermediate electrode such that the intermediate electrode is electrically between the source electrode and the memristor element. The resistive RAM module also comprises a sink electrode that is in contact with the memristor element such that the memristor element is electrically between the intermediate electrode and the sink electrode. The intermediate electrode has a closed-curve profile with at least one point.

Some embodiments of the present disclosure can also be illustrated as a method of forming a resistive RAM module. The method comprises applying a set of seed pillars to a surface of a layer of the resistive RAM module. The seed pillars are applied perpendicular to the surface. The layer comprises a source electrode embedded in an inter-layer dielectric. The method also comprises depositing nitride on the sidewalls of the seed pillars such that nitride accumulation creates a set of nitride borders that surround the seed pillars. Each nitride border in the set partially overlaps at least two other nitride borders such that a gap is formed in the center of the nitride borders. The method also comprises depositing an intermediate electrode on top of the source electrode and in the gap. The method also comprises removing the seed pillars. The method also comprises depositing a memristor element on the intermediate electrode and depositing a sink electrode on the memristor element.

Some embodiments of the present disclosure also can be illustrated as a computer program product. The computer program product comprises a computer readable storage medium that has program instructions embodied therewith. The program instructions are executable by a computer to cause the computer to perform the above method of forming a resistive RAM module.

DETAILED DESCRIPTION

Figure 1A:
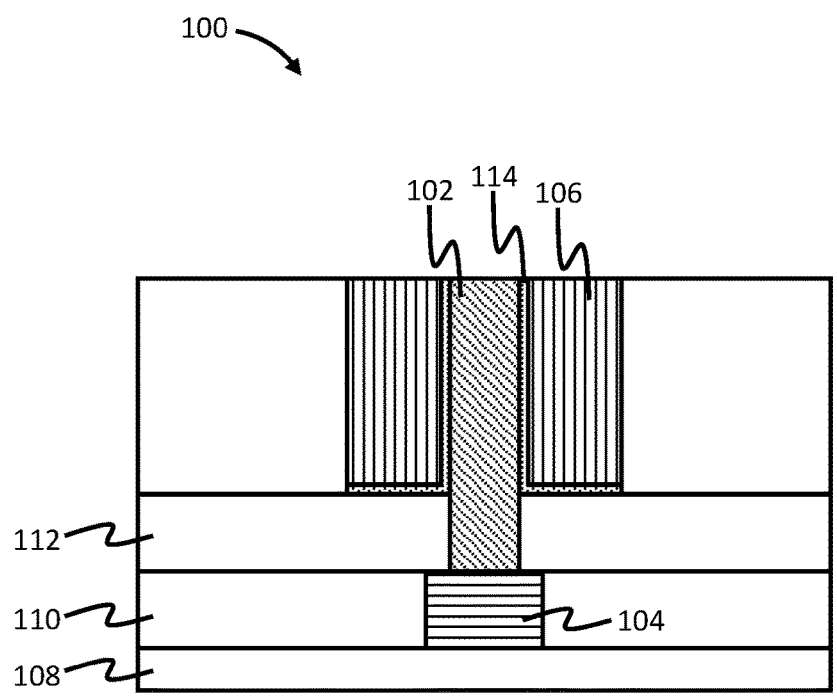
FIG. 1A depicts an abstract cross-section side view of a resistive RAM module with an intermediate electrode with a concave closed-curve profile.

Random access memory (referred to herein as "RAM") is a form of computer storage in which information can be stored for fast retrieval by another computer component, such as a processor. RAM, for example, is found in the cache memory of many processors and is used as the main memory in many computer systems. The structure of RAM and process by which RAM stores information varies based on the form of RAM used. For example, RAM used in processor cache sometimes the form of a six-transistor memory cell, whereas RAM used in system memory sometimes takes the form of a transistor-capacitor cell. In typical RAM formats, a cell can store one bit of information, and the state of the cell (e.g., charged or not charged) can be used to set the bit on or off (also referred to as setting the bit to "true" or "false," to "1" or "0," and some others).

In resistive RAM (referred to herein as "ReRAM") for example, a memory cell takes the form of a dielectric solid-state material, sometimes referred to as a "memristor" or "memristor element." For example, a ReRAM module sometimes takes the form of an oxide layer that is placed between two electrodes (sometimes referred to as a "source" electrode and a "sink" electrode, a "bottom" electrode and a "top" electrode, or a "word line" electrode and a "bit line" electrode) in a memory stack. While typically nonconductive, allowing oxide defects to form in this oxide layer can cause the resistance of the material to change, becoming electrically conductive. These oxide defects are sometimes referred to as "oxygen vacancies," and describe locations of oxide bonds at which the oxygen has been removed (typically migrated to other portions of the oxide layer). Once these defects are formed in a continuous path (sometimes referred to as a "filament" or "conductive filament") between two ends of the memristor, the electrical resistance between those two ends can drop significantly. Further, when an electric field of a particular voltage is subsequently applied to the memristor, the oxygen that was previously removed from the oxide-bond locations (i.e., the oxygen vacancy locations in the filament) can migrate back to the previous oxide-bond locations. When this happens, the "filament" is deformed, and the electrical resistances between those two ends of the memristor increase significantly again. This process is reversible. Thus, by applying electrical fields of particular voltages to the memristor, the memristor can be switched between a state of high resistance and a state of low resistance.

Thus, in ReRAM, an electrical charge can be applied to the memory module in order to switch the electrical resistance of the module between a first resistance value (sometimes referred to as "high resistance" and a second resistance value (sometimes referred to as "low resistance"). The state of the module can be taken advantage of to store information. For example, by setting each state to either a 1 or 0 (for example, setting the high-resistance state to "1" and the low-resistance stage to "0"), the state of that memristor can be used to store one bit of information.

Unlike some other types of RAM, ReRAM is considered non-volatile, meaning that it does not lose its stored information when it is not powered. In other words, the state of ReRAM (high resistance or low resistance) is stable when power is shut off from the computer system. For this reason, ReRAM has potential benefits in longer-term storage, such as a replacement (or supplement) to hard disk drives and solid-state drives. If successfully applied in long-term storage, ReRAM could offer significant storage boosts to computer systems due to ReRAM's low read latency and high write speed as compared with other long-term storage solutions.

However, difficulties in forming ReRAM can make utilizing ReRAM in storage systems difficult, if not completely unfeasible. For example, as discussed, in order for ReRAM to be formed, a sufficient voltage must be applied across the ReRAM module to form a continuous path of oxide defects (i.e., a conductive filament). This "sufficient voltage" is sometimes referred to as a formation voltage.

However, while the application of the formation voltage can be controlled, the precise location of the oxide defects that form as a result of the formation voltage can be very difficult to control. The random formation of a filament can cause variance in the resistance of the ReRAM device. In very large binary memory structures (e.g., memory chips with a relatively high amount of space between each memory cell on a bit line, a word line, or both), this may be unlikely to cause issues as the resistance variances of the on and off states are sufficiently far apart to discern with sensing circuitry.

In these large memory structures, memristor elements are also often large and isolated from other switching elements. Thus, even in ReRAM modules in which the chance of filament formation is relatively equal in all areas of the memristor element, the chance of the filament being formed at the very edge of the memristor is low. However, as memory structures, ReRAM modules, and memristor elements shrink, the distance between the center of the memristor element and the very edge of the memristor element also shrinks. Thus, the chances that a filament forms at the very edge of the memristor increases. As a result, variance in the resistance between the on and off states in these smaller ReRAM structures can be significant in smaller memory structures. In some instances, ReRAM filaments can form with a resistance that is between the "fully on" and "fully off" states. These partially formed states need to be controllably programmed in the application of artificial intelligence employed by a ReRAM array constituting a neural network. ReRAM devices without controllable filament formation will induce variance in the resistance of the partial states, which may require additional circuitry to sense or correct.

For example, aa filament that is formed close to the edge of a memristor element may be at higher-than-normal risk of leakage to other elements of the memory structures. Specifically, if a conductive filament is formed very close to the edge of a memristor, a portion of the filament may be close enough to a conductive material outside the memristor to form a conductive path to that conductive material. This may effectively result in a short between one end of the conductive filament and the conductive material, which may prevent the memristor from switching from a high-resistance state to a low-resistance state. In other words, the ReRAM device may be difficult to control at normal switching voltages, or may even be completely nonfunctional. As ReRAM devices become smaller, the chance of a filament forming near the edge of the memristor element increases. Thus, there is a growing need to control the location of the filament formation with greater precision.

Finally, the process of forming a conductive filament in a typical ReRAM memory structure can require a high formation voltage. Unfortunately, the formation voltage for a typical ReRAM module is often significantly higher than the voltage that is necessary to switch the ReRAM between resistance states after the conductive filament is formed. For example, a typical ReRAM module may be designed to operate at similar voltages as other memory systems (e.g., 1.2 volts). However, forming the conductive filament in such a ReRAM module may require over 4 volts (i.e., the formation voltage) to be applied to the ReRAM module. Further, applying this formation voltage typically requires applying the voltage through the same pathways as the voltage by which the ReRAM is switched between states when used in a system (for example, through a bit line and word line). In other words, the formation voltage must, in some applications, be applied through the final circuit design of the ReRAM module and the associated connections to the system.

Unfortunately, applying a formation voltage (e.g., 4V) through a circuit that is only designed to handle a memory switching voltage (e.g., 1.2V) can cause damage to the circuit. For example, in a typical complementary metal oxide semiconductor (sometimes referred to as "CMOS") system, applying a voltage that is significantly higher than the voltage for which the circuit is designed could cause a short to form between the gate and the conducting channel, or across the conducting channel between the source and the drain. In cutting-edge systems with very small components, high voltage can also damage contacts and wires.

To address some of the above issues, some embodiments of the present disclosure control the location of the formation of a conductive filament in a memristor element by forming an intermediate electrode electrically between a source electrode and a sink electrode. A memristor element may be formed electrically between the intermediate electrode and the sink electrode. As used herein, the term "electrically between" refers not necessarily to an element's physical location, but the positions of a set of elements with respect to current flowing between those elements. For example, an intermediate electrode is considered electrically between a source electrode and sink electrode if a current flowing from the source electrode to the sink electrode typically passes from the source electrode and through the intermediate electrode before passing to the sink electrode. Thus, applying a voltage across the source electrode and the sink electrode would cause the same voltage to be present across the intermediate electrode and the sink electrode, which are separated by the memristor element. If this voltage is of sufficient strength, oxygen deficiencies may begin to form in the memristor element, leading to the formation of a conductive channel.

The intermediate electrode may exhibit a closed-curve cross-section profile with one or more point. A point on a closed-curve cross-section profile (sometimes also referred to herein as a "closed curve profile" or just a "profile") typically occurs where two different curves meet (similar to, for example, the corner of a square or triangle, the point on a star, the point on a teardrop shape, or the bottom point on a "heart" shape). At these points, exposure of the memristor to the electric field caused by the voltage may be higher than elsewhere. As a result, oxygen deficiencies may be more likely to form at the points, causing the conductive filament to be more likely to form there as well. In this way, the location of the formation of the conductive filament can be controlled. This may enable the protection of the filament from leaking to other structures outside the memristor element.

The curves that make up the closed-curve profile of the intermediate electrode may be convex, concave, or straight. Thus, in some embodiments, the closed-curve profile may be a concave closed-curve profile in which one or more of the curves that make up the profile is concave. In such a profile, if two concave curves meet at a point, the cross-section profile (and thus, the electrode material) at that point may be particularly narrow. This may result in the exposure to the electric field being significantly higher at that point, and thus a conductive filament may be significantly more likely to form there as well.

Further, because the exposure to the electric field may be increased at the narrow points on the intermediate electrode, a conductive filament may form near those points at lower formation voltages. As noted earlier, the formation voltage of typical memristor elements is often higher than the voltage at which a memory structure is designed to operate. For this reason, reducing the voltage that is applied to the memory structure during the formation of a conductive filament may avoid damaging other components of the memory structure that are not designed to withstand those higher voltages.

Figure 1B:
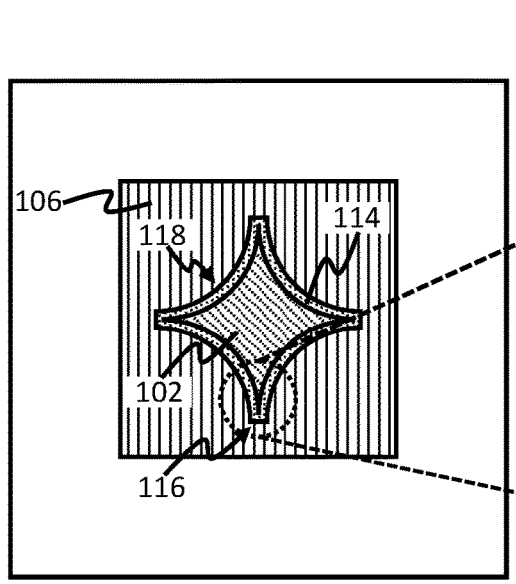
FIG. 1B depicts an abstract top view of the resistive RAM module.

FIG. 1A depicts an abstract cross-section side view of a resistive RAM module 100 with an intermediate electrode 102 with a concave closed-curve profile (illustrated in the view of FIG. 1B). Intermediate electrode 102 is electrically between source electrode 104 and sink electrode 106. Source electrode 104 is patterned on substrate layer 108 with interlayer dielectric 110. Intermediate electrode 102 is patterned on source electrode 104 and is embedded within insulating layer 112. Source electrode 104, intermediate electrode 102, and sink electrode 106 may be composed of, for example, titanium, titanium nitride, tungsten, or other conductive materials.

Memristor element 114 is electrically between intermediate electrode 102 and sink electrode 106. Memristor element 114 may be a metal oxide with insulative properties, such as hafnium oxide. In the presence of a sufficient voltage across intermediate electrode 102 and sink electrode 106, oxide defects may begin to form in memristor element 114, creating a conductive filament.

FIG. 1B depicts an abstract top view of resistive RAM module 100. As illustrated in FIG. 1B, the concave closed-curve profile of intermediate electrode 102 results in four narrow points (e.g., point 116), similar to a 4-point star. As will be discussed below, this profile can be used to control the formation of a conductive filament to one of four locations in memristor element 114. As is also visible in FIG. 1B, the closed-curve profile of intermediate electrode 102 is shared by memristor element 114, which was patterned onto intermediate electrode 102.

Finally, sink electrode 106 was patterned onto memristor element 114, causing the shape of sink electrode 106 to form a negative pattern of the concave closed-curve profile shared by intermediate electrode 102 and memristor element 114. This results in sink electrode 106 curving around and surrounding the narrow points of intermediate electrode 102, increasing the current through memristor element 114 at those areas when a voltage is applied across intermediate electrode 102 and sink electrode 106. This increased current is likely to lead to a greater number of oxide defects during the application of the voltage, which in turn increases the likelihood of a formation of a conductive filament at the four narrow points.

For example, the effects of a formation voltage may be significantly greater at point 116 than at area 118. In other words, the current that flows through memristor element 114 during application of a formation voltage may be higher at point 116 than at area. 118. As a result, oxide defects may be more likely to form across the memristor element at point 116 than across the memristor element at area 118. Further, in some embodiments, the increased current at point 116 may actually make it possible to form a conductive filament at point 116 at a lower formation voltage than would normally be required with typical memristor element topologies. In some instances, this lower formation voltage may result in the current that passes through the memristor element at area 118 to be insufficient to cause oxide defects. The resulting infeasibility of forming oxide defects at area 118 causes the location of the conductive filament even more controllable.

Figure 1C:
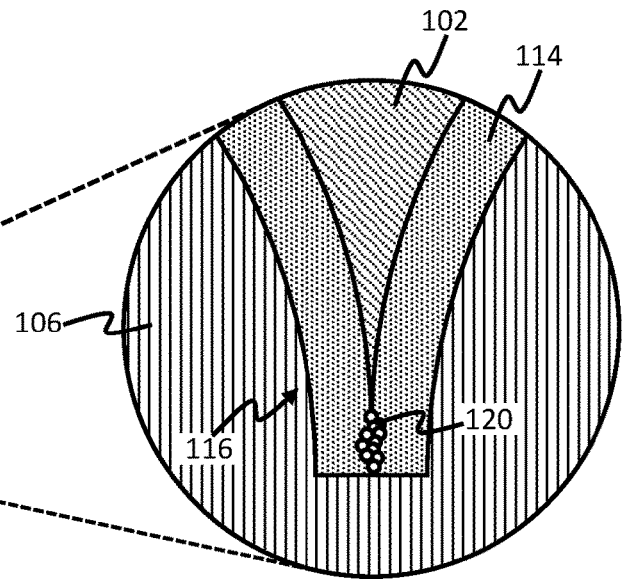
FIG. 1C depicts an abstract close-up top view of a conductive filament formed in a memristor element between the intermediate electrode and a sink electrode in the resistive RAM module.

FIG. 1C illustrates an example result of applying a formation voltage across intermediate electrode 102 and sink electrode 106 at point 116. Specifically, FIG. 1C depicts an abstract close-up top view of a conductive filament 120 formed across memristor element 114 between intermediate electrode 102 and sink electrode 106. Conductive filament 120 is a collection of oxide defects (illustrated as small white circles) that have collected at the same place in memristor element 114. As a result, a small path of conductivity has formed between intermediate electrode 102 and sink electrode 106. If the voltage is continuously applied, current will continue to flow through conductive filament 120, a greater number of oxide defects will form on filament 120, causing it to grow and the resistance across memristor element 114 at filament 120 to decrease. Once the filament has reached a target size and resistance, the application of the formation voltage can be terminated. At this point, application of a switching voltage across intermediate electrode 102 and sink electrode 106 should cause conductive filament 120 to switch between a low resistance state (for example, as shown in FIG. 1C) and a high resistance state, in which the oxide defects are replaced with oxide bonds.

It is of note that, while the profile in FIGS. 1A-1C feature a closed curve with only concave curves, some embodiments of the disclosure may feature an intermediate electrode with one or more curves of different shapes. For example, in some embodiments an intermediate electrode may feature a polygon profile (e.g., a square, triangle, or rectangle) in which all curves are straight line segments. Some embodiments of the present disclosure may feature a profile in which the curves are convex. And some embodiments of the present disclosure may feature a profile that comprises a mixture of two or all of convex curves, concave curves, and straight "curves" (i.e., straight line segments). In these profiles, the points at which two curves meet are likely to increase exposure to the electric field, and thus focus the formation of the conductive filament. However, a narrower point (such as a point at which two concave curves meet) may significantly increase that exposure, and thus may be more effective at focusing the formation of the conductive filament.

For the reasons discussed in FIGS. 1A-1C, therefore, patterning an electrode with a concave closed-curve profile in a ReRAM module can significantly increase the control of the location of a conductive filament formed in that module. Further, the increased current at the narrow points of such an electrode during the application of a formation voltage may permit lower formation voltages to be used, lowering the risk of damage to other structures in the memory module.

However, patterning an electrode with a concave closed-curve profile, such as the 4-point example illustrated in FIG. 1A-1C, may be difficult with typical process flows. Thus, some embodiments of the present disclosure illustrate a process flow for forming a memory cell with an electrode with a concave closed-loop profile.

Figure 2A:
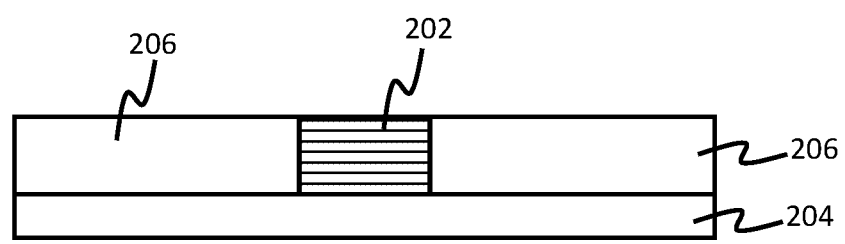
FIG. 2A depicts a side view of a source electrode on a substrate in a first stage of forming a resistive RAM (ReRAM) module with an intermediate electrode with a concave closed-curve profile, in accordance with some embodiments of the present disclosure.
Figure 2B:
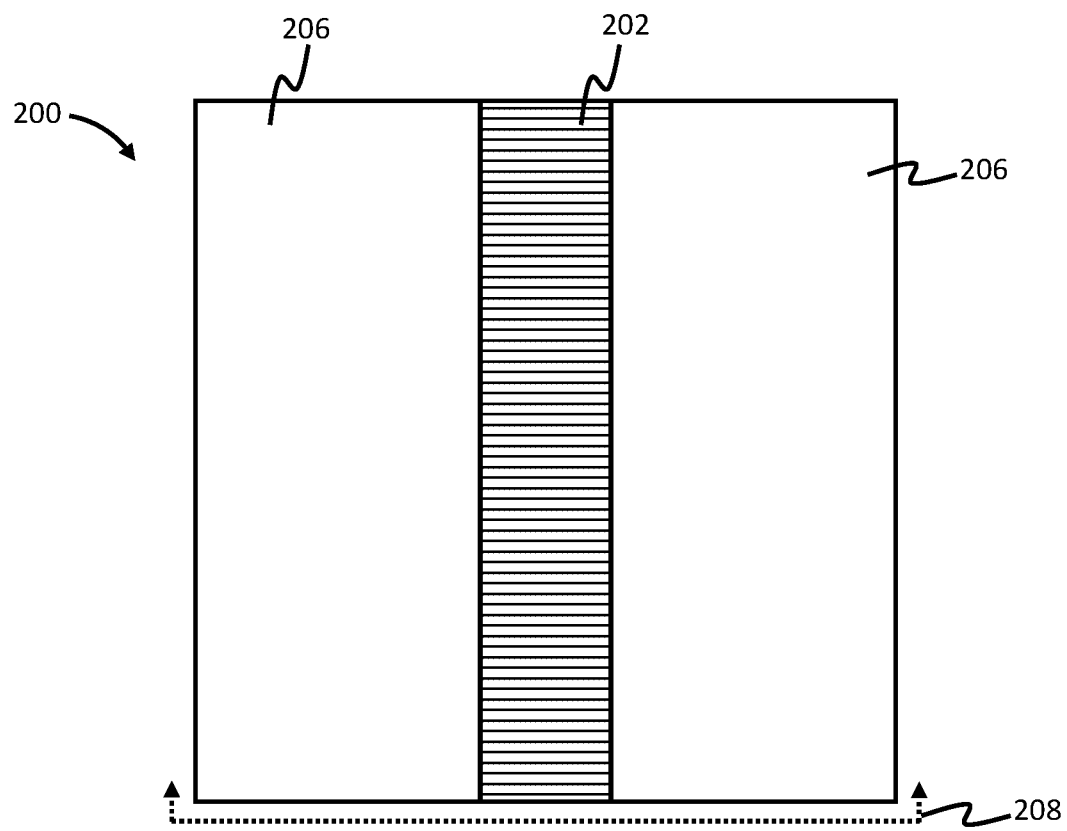
FIG. 2B depicts a top view of the source electrode in a first stage of forming the ReRAM module, in accordance with some embodiments of the present disclosure.
Figure 2C:
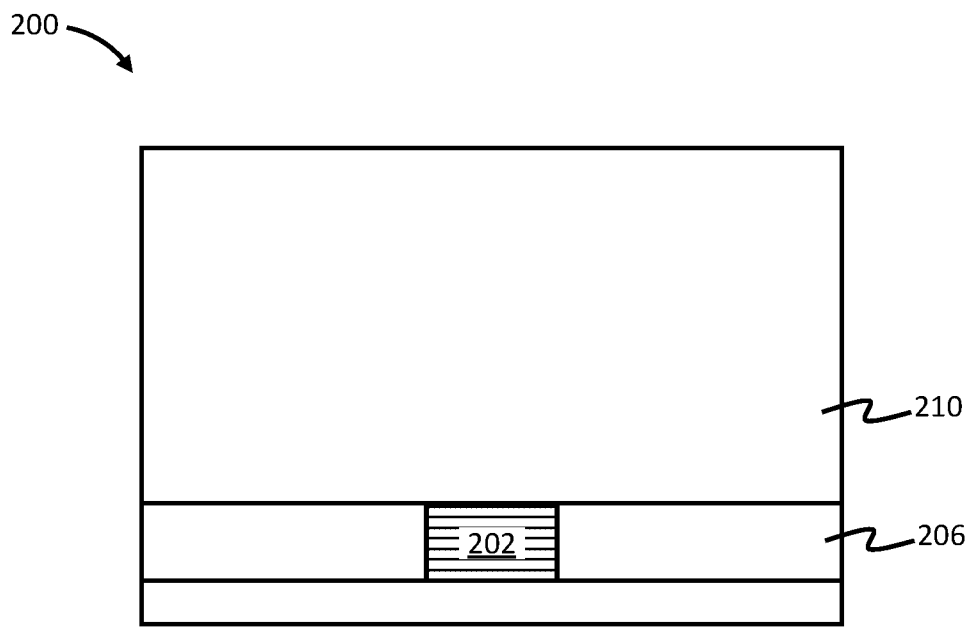
FIG. 2C depicts a side view of an oxide layer patterned on the source electrode in a second stage of forming the ReRAM module, in accordance with some embodiments of the present disclosure.
Figure 2D:
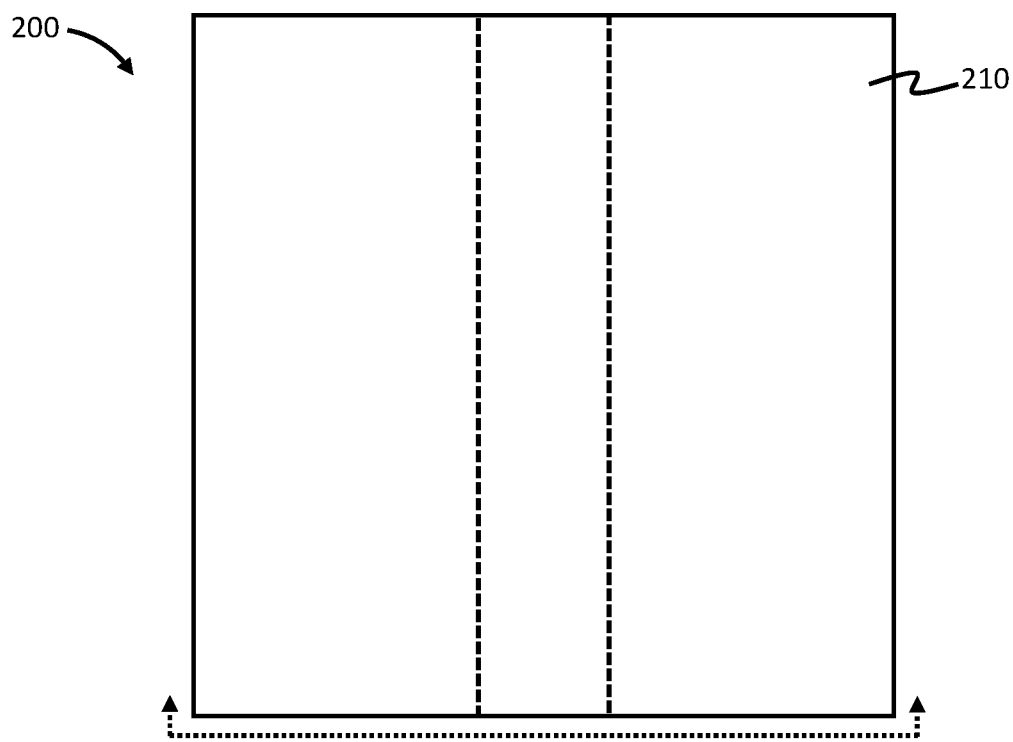
FIG. 2D depicts a top view of the oxide layer patterned on the source electrode in the second stage of forming the ReRAM module, in accordance with some embodiments of the present disclosure.
Figure 2E:
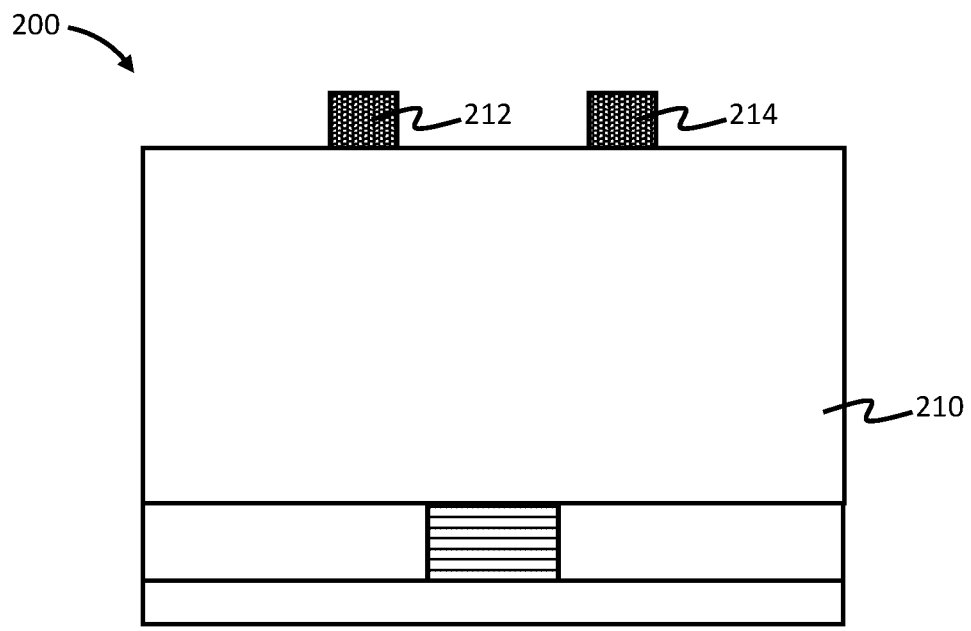
FIG. 2E depicts a side view of a set of hardmask elements added to the oxide layer in a third stage of forming the ReRAM module, in accordance with some embodiments of the present disclosure.
Figure 2F:
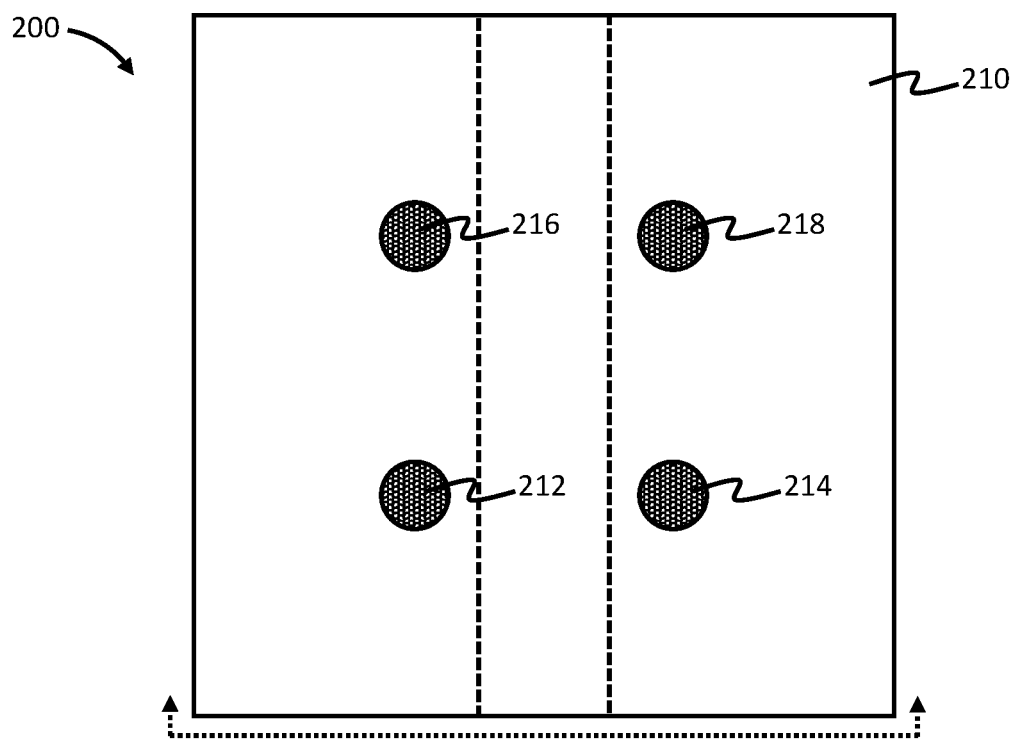
FIG. 2F depicts a top view of the set of hardmask elements in the third stage of forming the ReRAM module, in accordance with some embodiments of the present disclosure.
Figure 2G:
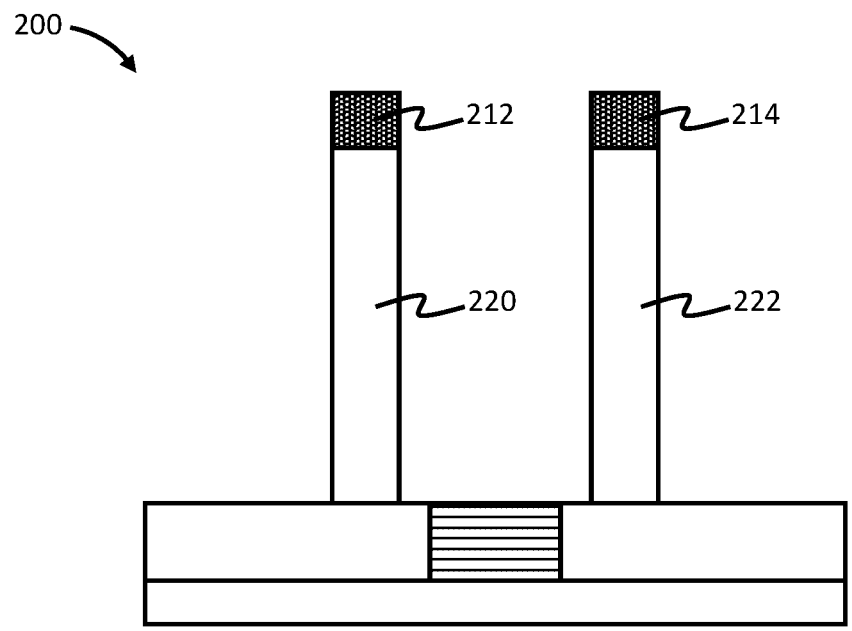
FIG. 2G depicts a side view of a set of patterned seed pillars in a fourth stage of forming the ReRAM module, in accordance with some embodiments of the present disclosure.
Figure 2H:
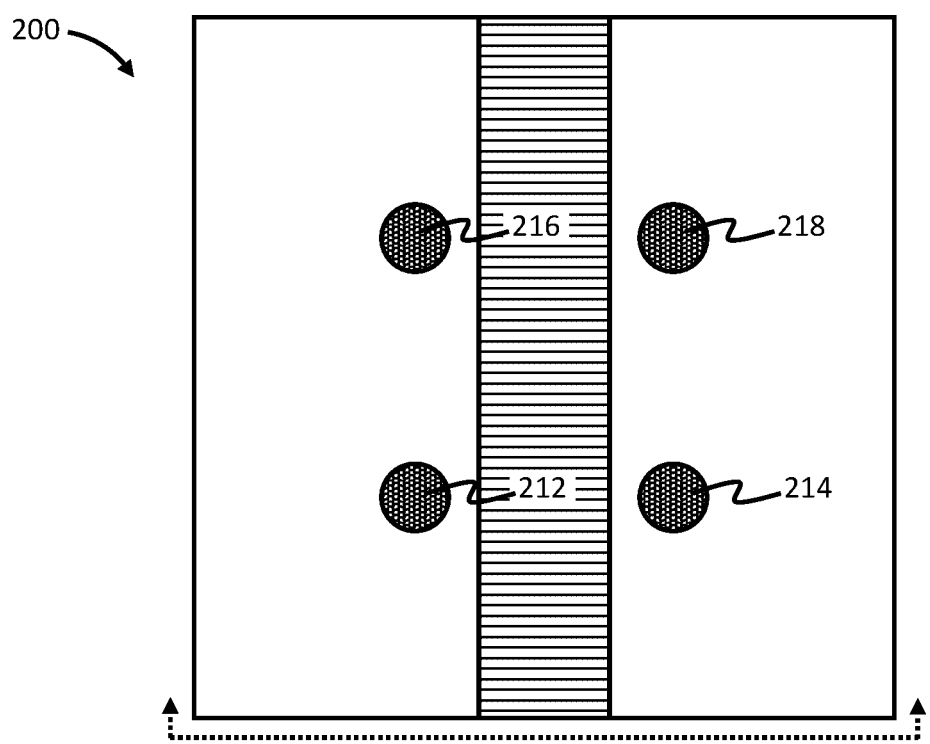
FIG. 2H depicts a top view of the set of patterned seed pillars in the fourth stage of forming the ReRAM module, in accordance with some embodiments of the present disclosure.
Figure 2I:
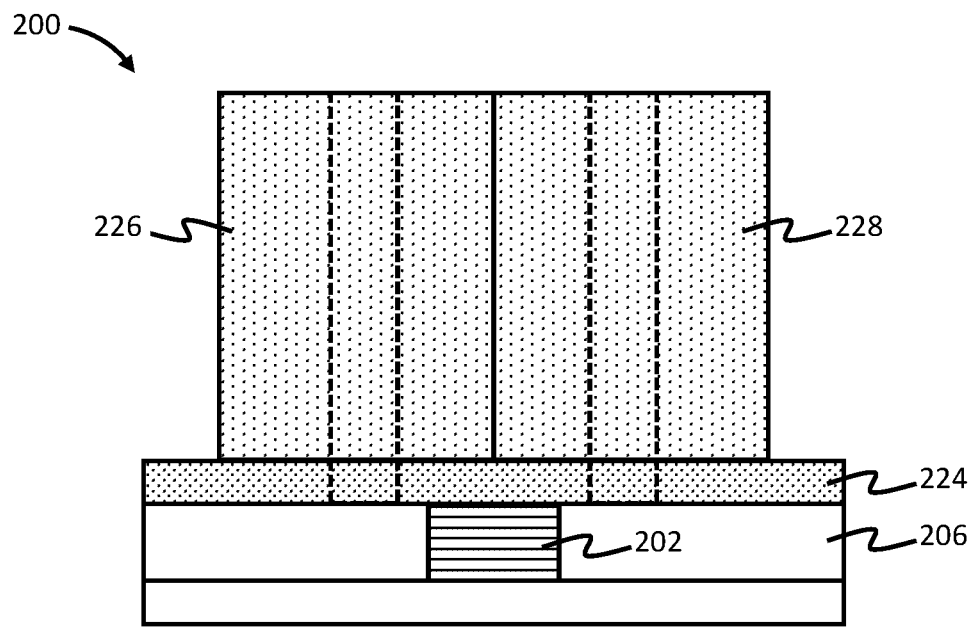
FIG. 2I depicts a side view of an accumulation of nitride borders on the sidewalls of the seed pillars in a fifth stage of forming the ReRAM module, in accordance with some embodiments of the present disclosure.
Figure 2J:
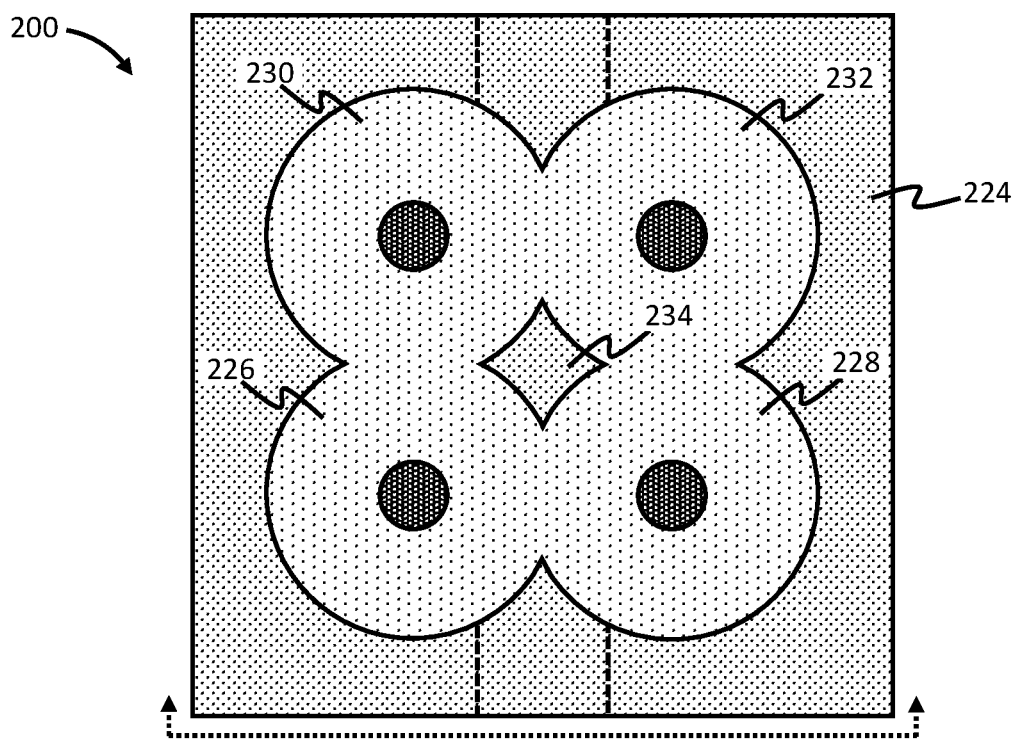
FIG. 2J depicts a top view of the nitride borders in the fifth stage of forming the ReRAM module, in accordance with some embodiments of the present disclosure.
Figure 2K:
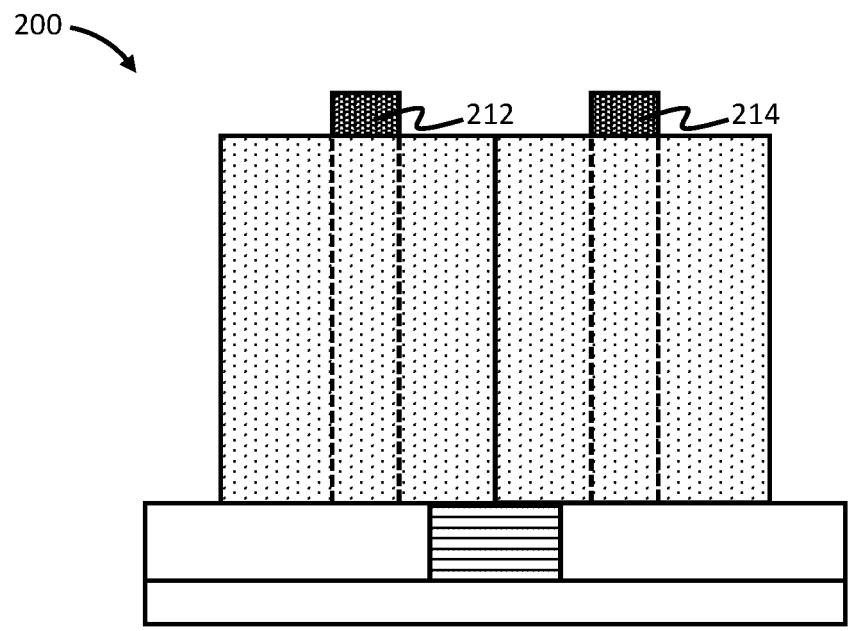
FIG. 2K depicts a side view of the nitride borders after removal of excess nitride in a sixth stage of forming the ReRAM module, in accordance with some embodiments of the present disclosure.
Figure 2L:
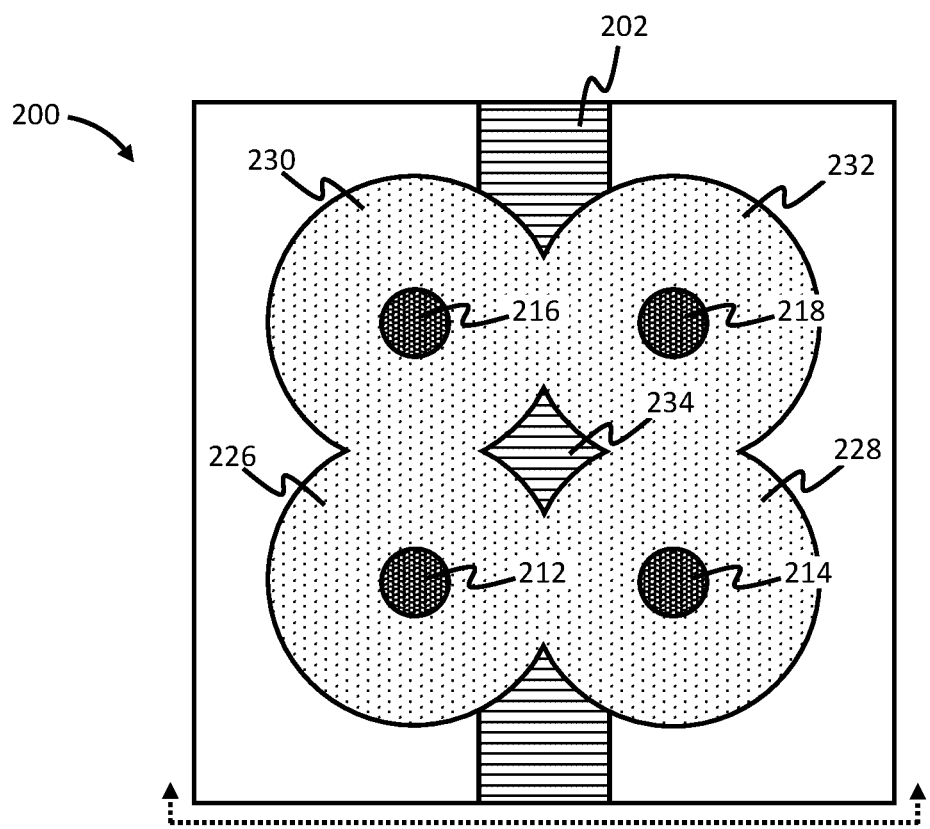
FIG. 2L depicts a top view of the source electrode in a gap between the nitride borders in the sixth stage of forming the ReRAM module, in accordance with some embodiments of the present disclosure.
Figure 2M:
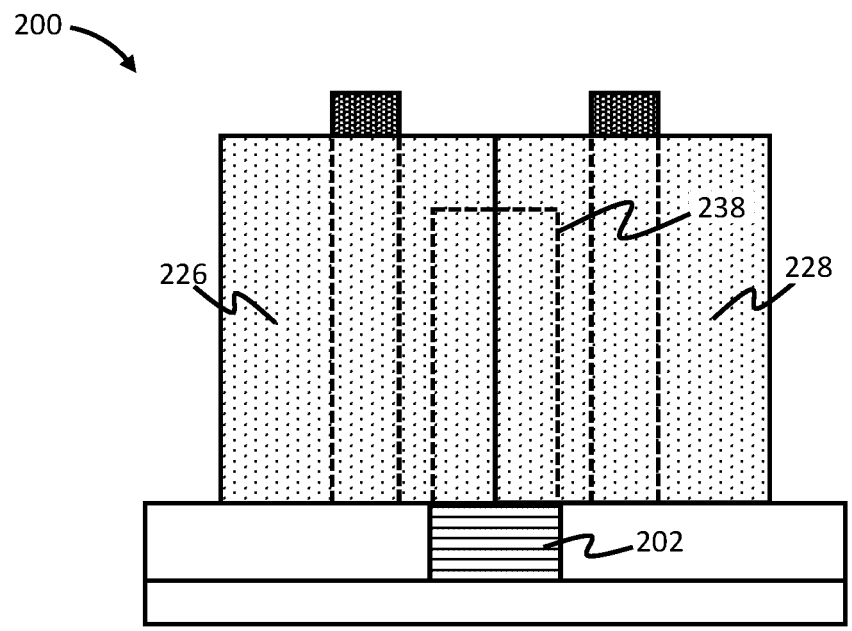
FIG. 2M depicts a side view of an intermediate electrode with a concave closed-curve profile in a seventh stage of forming the ReRAM module, in accordance with some embodiments of the present disclosure.
Figure 2N:
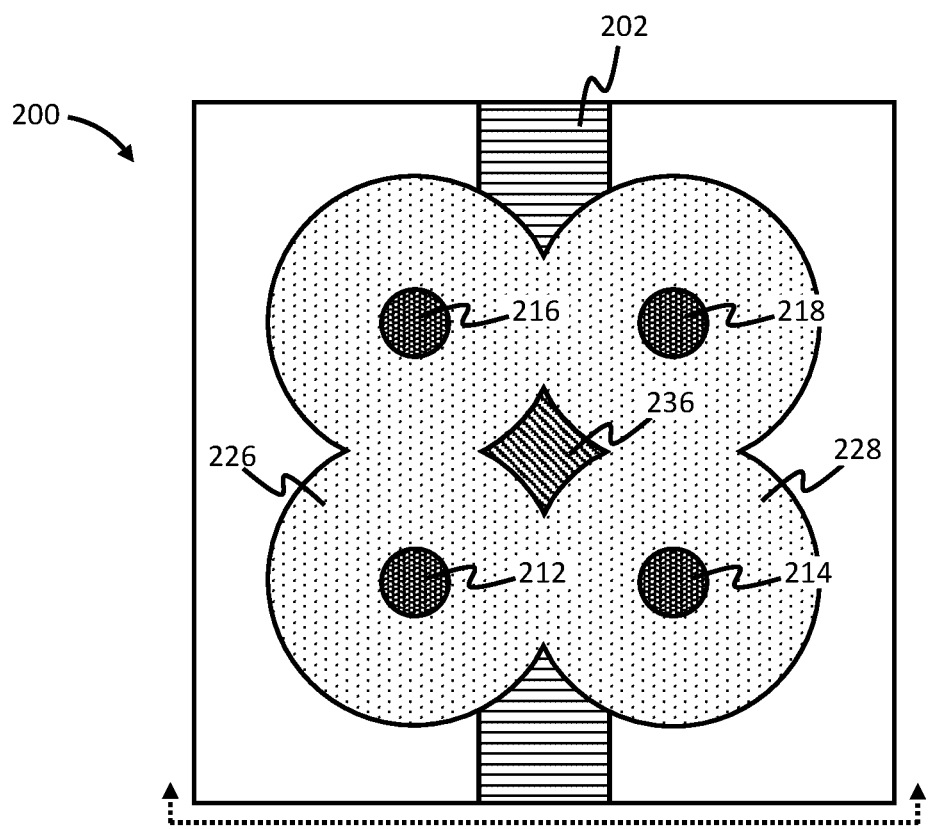
FIG. 2N depicts a top view of the intermediate electrode with a concave closed-curve profile in the seventh stage of forming the ReRAM module, in accordance with some embodiments of the present disclosure.
Figure 2O:
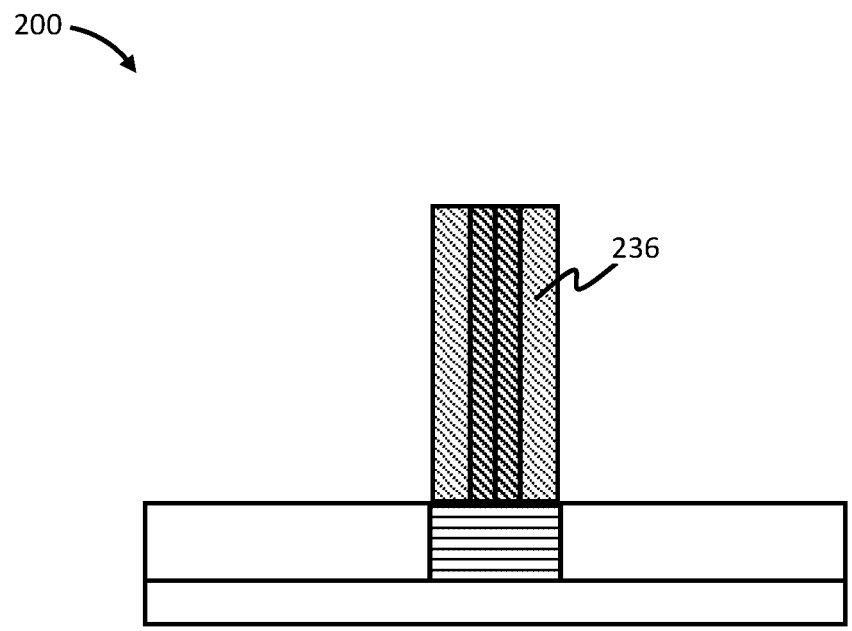
FIG. 2O depicts a side view of the intermediate electrode after removal of the nitride borders and seed pillars in an eighth stage of forming the ReRAM module, in accordance with some embodiments of the present disclosure.
Figure 2P:
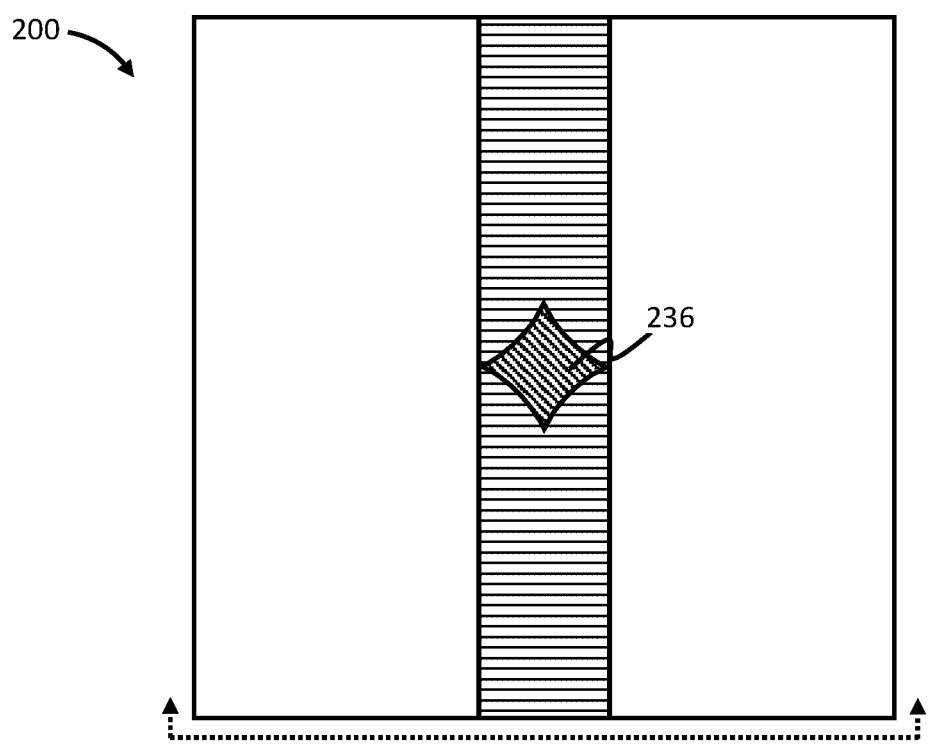
FIG. 2P depicts a top view of the intermediate electrode after removal of the nitride borders and seed pillars in the eighth stage of forming the ReRAM module, in accordance with some embodiments of the present disclosure.
Figure 2Q:
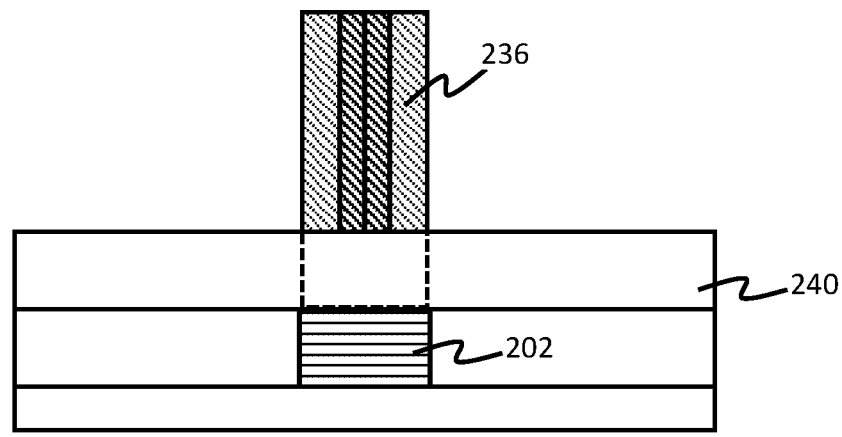
FIG. 2Q depicts a side view of the ReRAM module after addition of an insulating layer around the base of the intermediate electrode in a ninth stage of forming the ReRAM module, in accordance with some embodiments of the present disclosure.
Figure 2R:
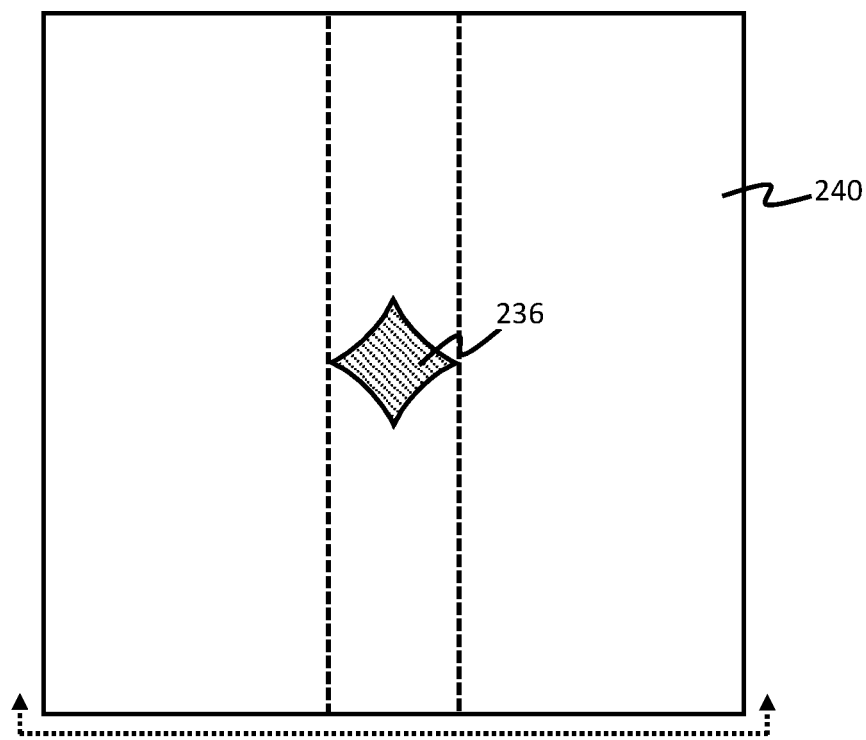
FIG. 2R depicts a top view of the ReRAM module after addition of the insulating layer around the base of the intermediate electrode in the ninth stage of forming the ReRAM module, in accordance with some embodiments of the present disclosure.
Figure 2S:
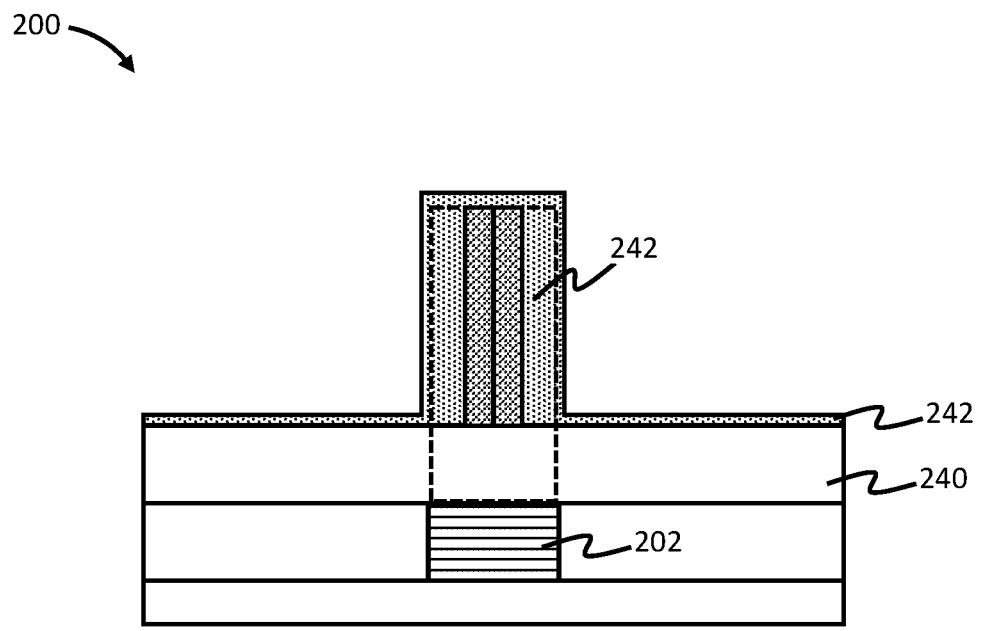
FIG. 2S depicts a side view of a memristor element added to the intermediate electrode in a tenth stage of forming the ReRAM module, in accordance with some embodiments of the present disclosure.
Figure 2T:
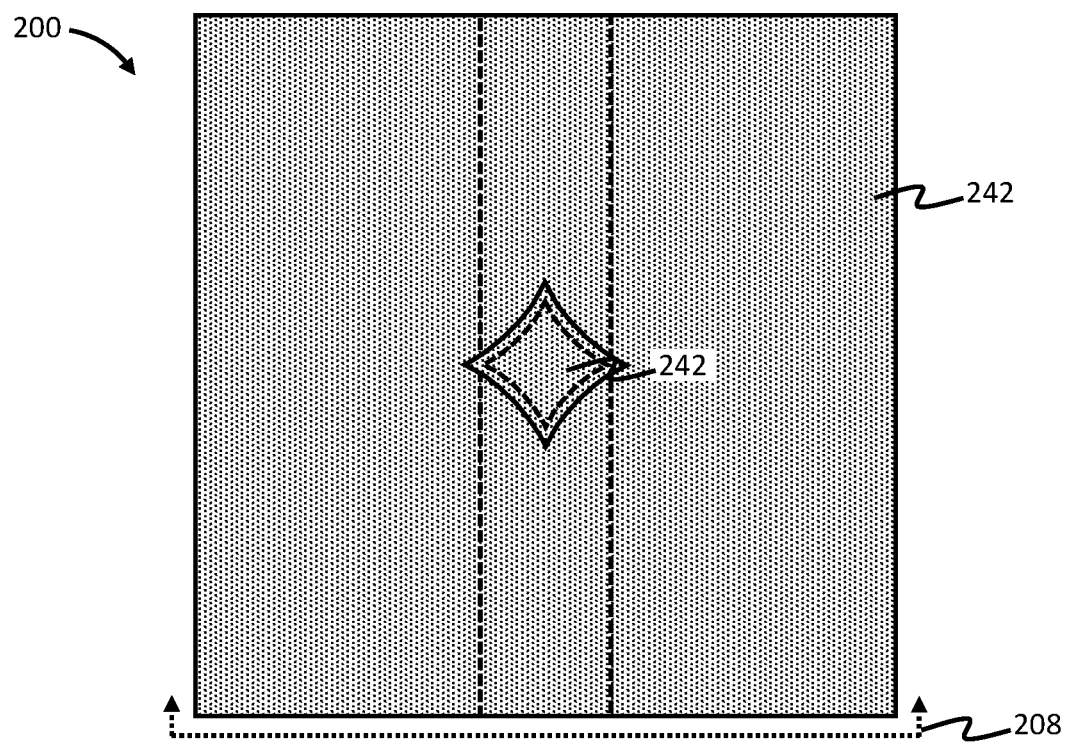
FIG. 2T depicts a top view of the memristor element added to the intermediate electrode in the tenth stage of forming the ReRAM module, in accordance with some embodiments of the present disclosure.
Figure 2U:
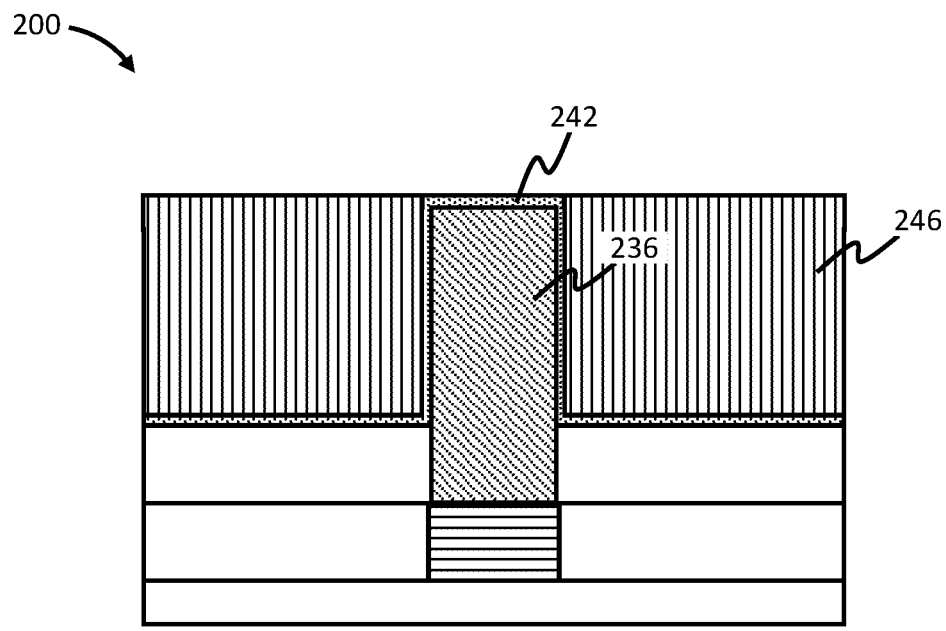
FIG. 2U depicts a side cross-section view of the ReRAM module after addition of a sink electrode to the memristor element in an eleventh stage of forming the ReRAM module, in accordance with some embodiments of the present disclosure.
Figure 2V:
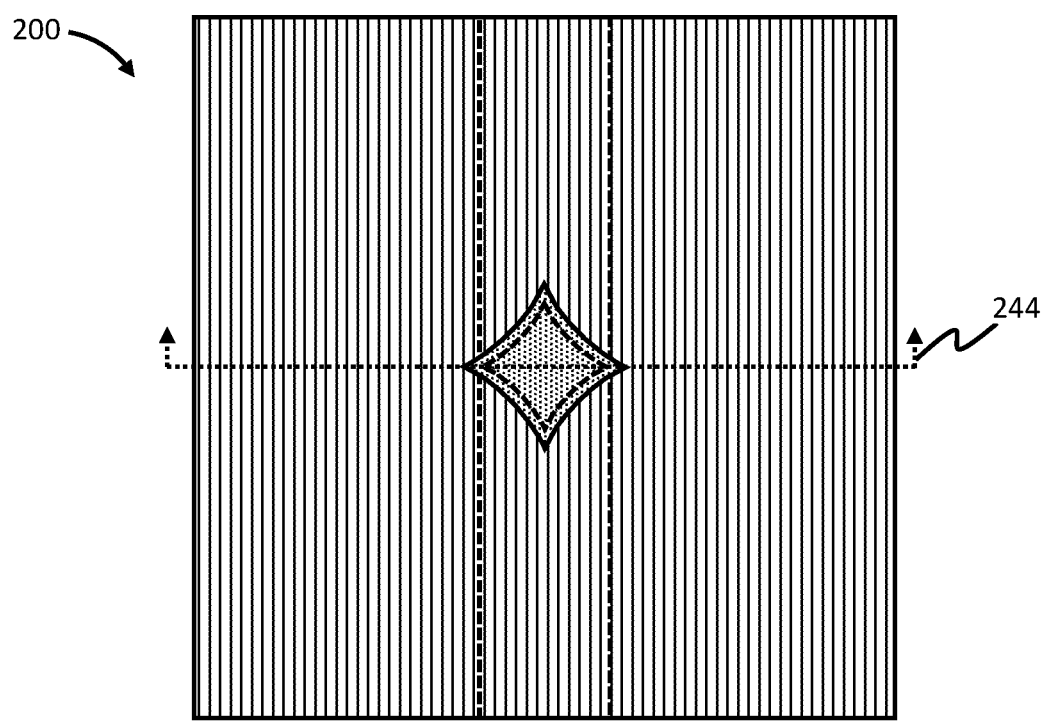
FIG. 2V depicts a top view of the ReRAM module after addition of the sink electrode in the eleventh stage of forming the ReRAM module, in accordance with some embodiments of the present disclosure.
Figure 2W:
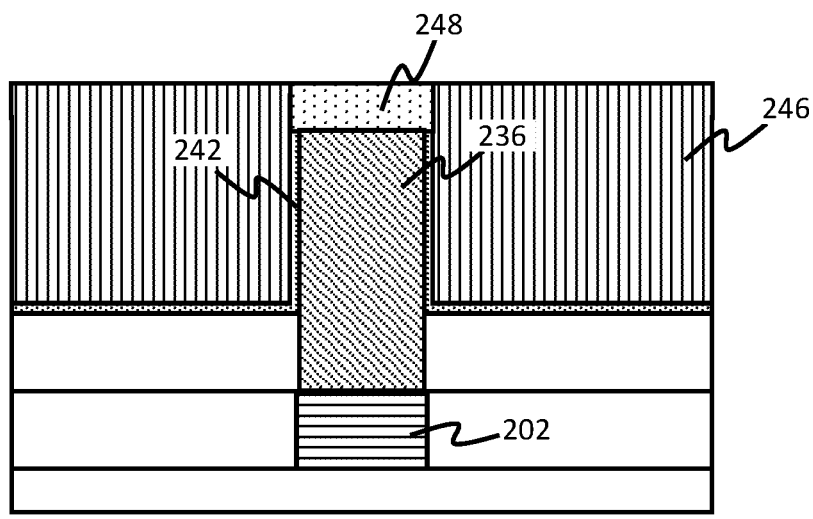
FIG. 2W depicts a side cross-section view of the ReRAM module after addition of a nitride cap to the intermediate electrode and memristor element in a twelfth stage of forming the ReRAM module, in accordance with some embodiments of the present disclosure.
Figure 2X:
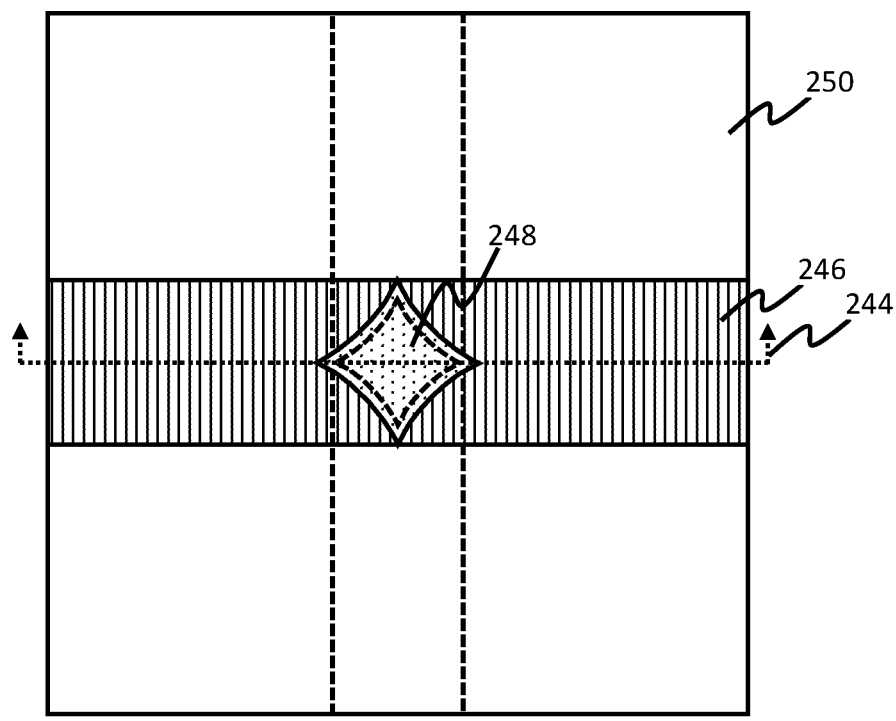
FIG. 2X depicts a top view of the ReRAM module after addition of the nitride cap and removal of excess sink-electrode material, in accordance with some embodiments of the present disclosure.

FIGS. 2A through 2X, for example, illustrate a process flow by which a 4-point electrode (such as intermediate electrode 102) could be formed in a ReRAM module. FIG. 2A depicts a side view of a first stage of forming ReRAM module 200 in which source electrode 202 is formed on semiconductor substrate 204 with interlayer dielectric 206. Similarly, FIG. 2B depicts a top view of the first stage of forming ReRAM module 200. The orientation of source electrode 202 is visible in FIG. 2B, as is inter-layer dielectric 206. Further, the position from which ReRAM module 200 is viewed in FIG. 2A is also provided by perspective line 208. In some embodiments, source electrode 202 may be part of a larger "bit line" electrode or a "word line" electrode. Suitable electrode materials for source electrode 202 include, but are not limited to, metals such as titanium (Ti) and/or tungsten (W). In another embodiment, source electrode 202 can include a metal nitride (for example, titanium nitride, tantalum nitride, titanium aluminum nitride, or tungsten nitride), or a metal-semiconductor compound (for example, a metal silicide), or a combination including at least one of the foregoing. The metal silicide can include nickel silicide, cobalt silicide, tungsten silicide, titanium silicide, tantalum silicide, platinum silicide, erbium silicide, or a combination including at least one of the foregoing.

FIGS. 2C and FIG. 2D depict a side view and top view of a second stage of forming ReRAM module 200. In this stage, an oxide layer 210 is deposited on top of source electrode 202 and interlayer dielectric 206. As such, source electrode 202 and interlayer dielectric are temporarily covered by oxide layer 210. For clarity, FIG. 2D illustrates the position of source electrode 202 under oxide layer 210 as a dotted line.

FIGS. 2E and 2F depict a side view and top view of a third stage of forming ReRAM module 200. In this stage, circular hardmask deposits 212, 214, 216, and 218 are deposited upon oxide layer 210. In some embodiments, hardmask deposits 212-218 may be a nitride hardmask. While hardmask deposits 212-218 are presented in FIGS. 2E and 2F as circular, in some embodiments other shapes may be used. As illustrated, hardmask deposits 212-218 surround a location that is centered on source electrode 202. As will be discussed in FIGS. 2G through 2L, the shape of these hardmask deposits may impact the shape of seed pillars in and nitride accumulations on those seed pillars.

FIGS. 2G and 2H depict a side view and a top view of a fourth stage of forming ReRAM module 200. In this stage, most of oxide layer 210 has been removed, but the oxide material underneath hardmask deposits 212-218 remains. This oxide material forms four seed pillars that correspond to the four hardmask deposits in number, location, and shape. As illustrated, the four seed pillars are cylinders with a radius that matches the radius of hardmask deposits 212-218. Only two (seed pillars 220 and 222) are visible in FIG. 2G. All four seed pillars are covered by hardmask deposits 212-218 in FIG. 2H.

FIGS. 2I and 2J depict a side view and a top view of a fifth stage of forming ReRAM module 200. In this stage, a bottom nitride layer 224 has been applied to the top surfaces of interlayer dielectric 206 and source electrode 202. Further, an accumulation of nitride on the sidewalls of the four seed pillars (including hardmask deposits 212-218) has formed four nitride borders 226, 228, 230, and 232. Nitride borders 226-232, as illustrated, take the form of nitride rings because the four seed pillars that formed nitride borders 226-232 have a circular cross-section profile. However, other shapes of nitride borders could be created by adjusting the shape of the seed pillars. For example, if a seed pillar had a square cross-section profile, the nitride border of that seed pillar would have an octagon shape. If a seed pillar had a closed curve profile with convex sides, a nitride border on that seed pillar may have a similar profile.

Nitride borders 226_232 have a radius that is large enough to cause nitride borders 226-232 to partially overlap. As a result, nitride borders 226-232 effectively form a single structure with gap 234 between them. As illustrated by FIG. 2J, gap 234 has a concave closed-curve profile with four points when viewed from above. Of note, it would be possible to vary the shape of gap 234 by varying the shape of the four seed pillars and thus the profile of one or more of nitride borders 226-232. For example, if all four seed pillars had a same square shape but maintained their square position, all nitride borders 226-232 would have an octagon profile. The gap between nitride borders 226-232 would be formed by one diagonal side of each octagon, causing gap 234 to have a square profile.

FIGS. 2K and 2L depict a side view and a top view of a sixth stage of forming ReRAM module 200. In this stage, bottom nitride layer 224 has been removed. This may have been performed by, for example, a top-down reactive ion etching process. As a result, excess nitride from the top of nitride borders 226-232 has also been removed, exposing some of hardmask deposits 212-218. Of note, removing bottom nitride layer 224 has exposed the portion of source electrode 202 that is beneath gap 234. As a result, the portion of source electrode 202 that is visible beneath gap 234 has a four-point, concave, closed-curve profile that matches the profile of gap 234.

FIGS. 2M and 2N depict a side view and a top view of a seventh stage of forming ReRAM module 200. In this stage, intermediate electrode 236 has been inserted into gap 234 between nitride borders 226-232. The materials out of which intermediate electrode 236 may be formed may be the same as the materials out of which source electrode 202 may be formed (e.g., metals such as Ti, or W; metal nitrides such as titanium nitride, and tantalum nitride; or a metal-semiconductor compound such as a metal silicide).

In some embodiments, intermediate electrode 236 can include a stack of thin conductive layers and thick metal layer. The stack of conductive layer can include a stack structure of metal nitride (for example, titanium nitride, tantalum nitride, or tungsten nitride), an aluminum-containing alloy (for example, TiAl, TiAlC, TaAl, TaAlC), titanium, tantalum, or a combination including at least one of the foregoing. Specifically, intermediate electrode 236 can include a stack structure of titanium nitride and TiAlC. The metal layer can include titanium, tantalum, tungsten, molybdenum, platinum, hafnium, copper, aluminum, gold, nickel, iridium or a combination including at least one of the foregoing; specifically, tungsten. The electrode material for intermediate electrode 236 can be deposited using a process such as CVD, ALD, PVD, sputtering, evaporation, and electrochemical plating.

Intermediate electrode 236 is depicted in FIG. 2M as dotted line 238, because intermediate electrode 236 is located behind nitride borders 226 and 228 from the perspective shown in FIG. 2M. In other words, intermediate electrode 236 is not directly visible from FIG. 2M. However, in FIG. 2N, the top of intermediate electrode 236 is visible. As a result of forming within gap 234, intermediate electrode 236 is not only formed directly on top of electrode 202, but also has a four-point, concave, closed-curve profile that matches the profile of gap 234. Of note, intermediate electrode 236 is illustrated as being slightly shorter than nitride borders 226-232. This is not strictly required; in some embodiments, intermediate electrode 236 could be as tall as nitride borders 226-232 or even as tall as hardmask deposits 212-218. However, portions of intermediate electrode 236 that form outside of gap 234 may need to be removed with an etching process in order to prevent future shorts between intermediate electrode 236 and a sink electrode.

FIGS. 2O and 2P depict a side view and a top view of an eighth stage of forming ReRAM module 200. In this stage, nitride borders 226-232, hardmask deposits 212-218, and seed pillars 220, 222, and the two unnumbered seed pillars have all been etched off source electrode 202 and interlayer dielectric 206. This has exposed intermediate electrode 236, as illustrated in FIG. 2O.

FIGS. 2Q and 2R depict a side view and a top view of a ninth stage of forming ReRAM module 200. In this stage, an insulating layer 240 (e.g., an oxide layer) has been formed over source electrode 202 and over the bottom portion of intermediate electrode 236. In some embodiments, the insulating layer 240 is a high-k dielectric. In some embodiments, the insulating layer 240 is a transitional metal oxide. Examples of materials that can be suitable for ReRAM dielectric include $NiO_x$, $Ta_yO_x$, $TiO_x$, $HfO_x$, $Ta_yO_x$, $WO_x$, $ZrO_x$, $Al_yO_x$, $SrTiO_x$, or a combination comprising at least one of the foregoing. Conformal deposition processes include, but are not limited to, CVD, ALD, and PVD. According to an exemplary embodiment, the insulating layer 204 can have a thickness of 1 to 15 nanometers, specifically, 3 to 9 nanometers, more specifically, 4 to 7 nanometers. This insulating layer 240 may serve to insulate source electrode 202 from other conductive portions of ReRAM module 200. In other words, current that is flowing through source electrode 202 may only flow to other portions of ReRAM module 200 through intermediate electrode 236. In the interest of clarity, the portions of intermediate electrode 236 and source electrode 202 that are covered by insulating layer 240 have been illustrated here by dotted lines.

FIGS. 2S and 2T depict a side view and a top view of a tenth stage of forming ReRAM module 200. In this stage, memristor element 242 has been deposited over insulating layer 240 and intermediate electrode 236. As such, intermediate electrode 236 is completely covered by memristor element 242 both from the top-view perspective of FIG. 2T and also from the side-view perspective of FIG. 2S (the origin of which is indicated by perspective line 208). Because memristor element 242 is applied to intermediate electrode 236, memristor element 242 shares the four-point concave closed-curve profile of intermediate electrode 236, as is illustrated in FIGS. 2S and 2T.

Memristor element 242 may be a metal oxide with insulative properties, such as hafnium oxide or tungsten trioxide. However, other resistive switching materials may also be used. For example, rather than a metal oxide, another metal chalcogen, such as a metal sulfide, may be used. These metal chalogens typically form switching materials of 5 nm nominal thickness. However, in some embodiments memristor element 242 could be formed of thinner switching materials, such as hexagonal boron nitride (h-BN), molybdenum disulfide ($MoS_2$) or tungsten disulfide ($WS_2$).

Once again in the interest of clarity, the portions of intermediate electrode 236 and source electrode 202 that are covered by insulating layer 240 or memristor element 242 have been illustrated here by dotted lines.

FIGS. 2U and 2V depict a side view and a top view of an eleventh stage of forming ReRAM module 200. Of note, the perspective from which the side view of FIG. 2U is illustrated is different than in previous figure views. As shown by perspective line 244 in FIG. 2V, FIG. 2U illustrates a side cross-section view of ReRAM module 200. As such, even though intermediate electrode 236 is completely covered by memristor element 242, it is visible in FIG. 2U. In the eleventh stage of forming ReRAM module 200, sink electrode 246 is deposited on memristor element 242. Suitable electrode materials for sink electrode 246 include, but are not limited to, metals such as titanium (Ti), titanium nitride (TiN) and/or tungsten (W). In another embodiment, sink electrode 246 can include a metal nitride (for example, titanium nitride, tantalum nitride, titanium aluminum nitride, or tungsten nitride), or a metal-semiconductor compound (for example, a metal silicide), or a combination including at least one of the foregoing. The metal silicide can include nickel silicide, cobalt silicide, tungsten silicide, titanium silicide, tantalum silicide, platinum silicide, erbium silicide, or a combination including at least one of the foregoing. Sink electrode 246 may be part of an eventual bit line electrode for several memory cells in ReRAM module 200. This deposition places memristor element 242 electrically between intermediate electrode 236 and sink electrode 246, enabling a potential conductive filament formation through memristor element 242.

FIGS. 2W and 2X depict a side view and a top view of twelfth stage of forming ReRAM module 200. In the twelfth stage, intermediate electrode 236 and memristor element 242 have been recessed within sink electrode 246. Further, an insulating nitride cap 248 has been formed in the resulting recess on top of intermediate electrode and memristor element 242. This may help to prevent shorts from forming between intermediate electrode 236 and sink electrode 246 at the top of intermediate electrode. These shorts could occur, for example, if memristor element 242 does not cover the top of intermediate electrode 236 and if memristor element 242 were particularly thin near the top. Insulating nitride cap 248 may not be required for proper functioning of ReRAM module 200, therefore, but may prevent potential failures.

In the twelfth stage of forming ReRAM module 200, some of sink electrode 246 has been etched away, forming a line that is perpendicular to source electrode 202. This may enable sink electrode 246 to serve as a bit line for ReRAM module 200 in combination with source electrode 202 serving as a word line for ReRAM module 200. As illustrated, an insulating layer 250 (e.g., a dielectric layer) has been formed on ReRAM module 200 where portions of sink electrode 246 were removed.

After the twelfth stage of forming ReRAM module 200, a formation voltage could be applied between source electrode 202 and sink electrode 246. Through the application of this formation voltage, a conductive filament could be formed in one of the four narrow points of memristor element 242. As such, the concave closed-loop profile of intermediate electrode 236 and memristor element 242 can be taken advantage of to control the location of the conductive filament, preventing potential filament failures. A discussion and presentation of such a conductive filament formation is provided by FIG. 1C.

Figure 3:
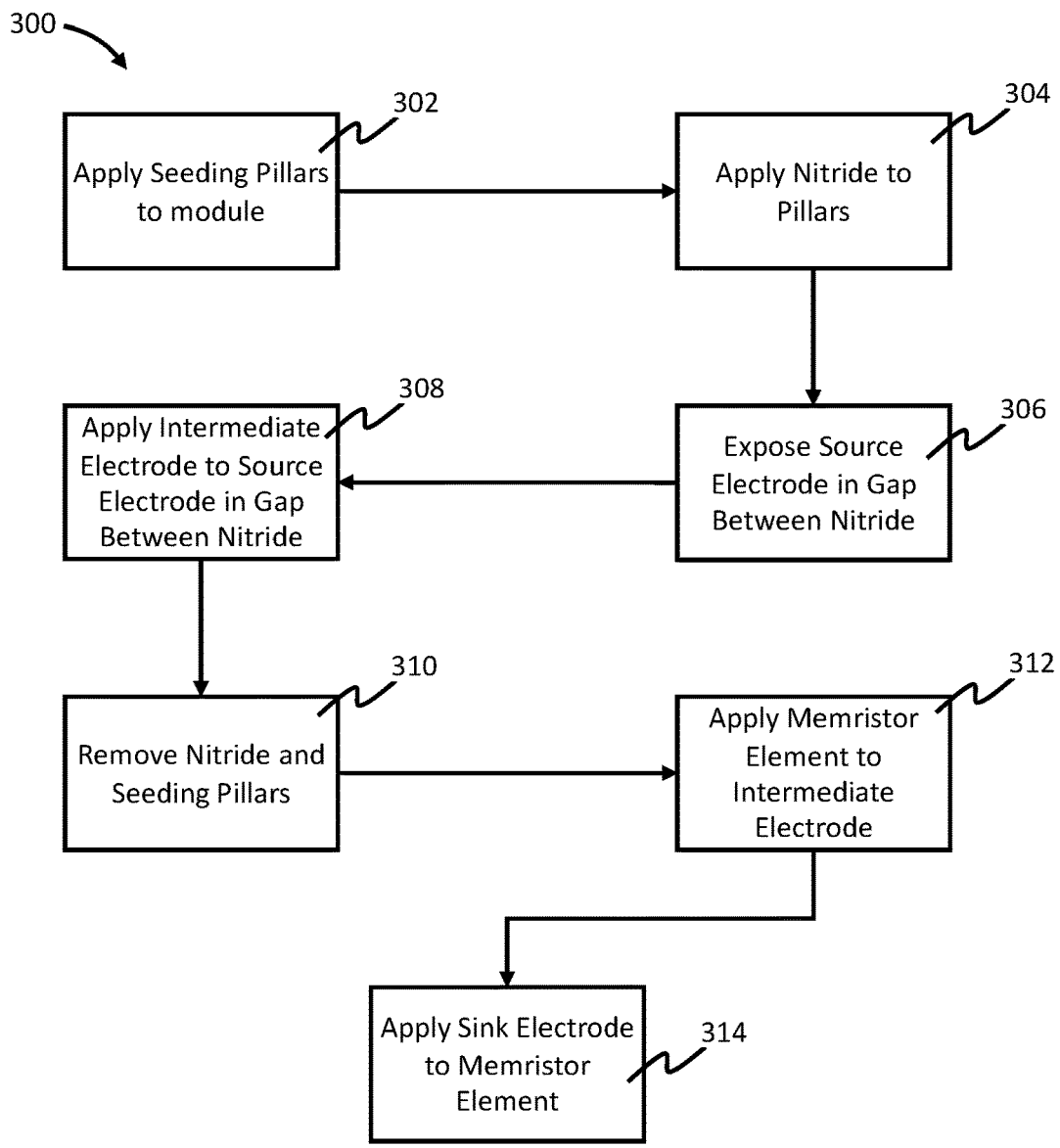
FIG. 3 depicts an example method of forming a resistive RAM (ReRAM) module with an intermediate electrode with a closed-curve profile, in accordance with some embodiments of the present disclosure.

As discussed in relation to FIGS. 2A through 2X, some embodiments of the present disclosure can take the form of a process for forming a ReRAM module. Thus, for the purposes of understanding, FIG. 3 presents an example method 300 of forming a resistive RAM (ReRAM) module with an intermediate electrode with a concave closed-curve profile, in accordance with some embodiments of the present disclosure.

Method 300 begins in block 302, in which seed pillars are applied to a module. In some embodiments, the seed pillars may be applied to a source electrode or an insulating layer into which that source electrode is embedded. Applying these seed pillars may, for example, take the form of applying a layer of oxide to the source electrode and insulating layer, applying hardmask deposits to the top of the oxide layer, and etching away the oxide that is not beneath the hardmask deposits. As discussed in relation to FIGS. 2E through 2H, this may cause the seed pillars to take the form of pillars below the hardmask deposits that share the same cross-section profile as the hardmask deposits. As such, the hardmask deposits may be positioned such that a portion of a source electrode is located directly in the center between the hardmask deposits, resulting in the seed pillar surrounding that portion of the source electrode. In some embodiments, one or more of the hardmask deposits may have a circular profile, causing the corresponding seed pillars to share that circular profile (i.e., forming seed pillar cylinders).

Method 300 then proceeds to block 304 in which an accumulation of nitride is applied to the sidewalls of the seed pillars. This may result in a formation of nitride borders around the seed pillars that overlap, creating a gap between the nitride borders. In some embodiments, one or more nitride borders may be formed on seed pillars with a circular profile, causing nitride borders to take the form of nitride rings. Example nitride rings are depicted in FIGS. 2I-2M and 4 and 5.

Method 300 then proceeds to block 306 in which a source electrode at the bottom of the gap between the seed pillars and nitride accumulation. Exposing the source electrode may include etching away a top layer of the nitride accumulation that formed on the top of the source electrode (and other portion of the ReRAM module). Exposing the source electrode after application of nitride is illustrated in FIGS. 2K and 2L.

Method 300 then proceeds to block 308 in which an intermediate electrode is applied on top of the source electrode in a way that fills much of, or all of, the gap between the accumulation of nitride. This intermediate electrode may be composed, for example of titanium, titanium nitride, tungsten, or other conductive materials that are resistant to etching.

This may result in an intermediate electrode that has a top-down cross-section profile that is similar to or the same as the top-down cross-section profile of the gap between the nitride accumulation. For example, the intermediate electrode may have a concave closed-curve profile with several narrow points. Such a profile is illustrated in FIGS. 1A-1C, 2N-2R, 4, and 5.

Method 300 then proceeds to block 310, in which the accumulated nitride and seed pillars (including the hardmask deposits) are removed from the ReRAM module. This may be performed, for example, with a reactive ion etching process that is not sufficient to remove the intermediate electrode.

Once the nitride and seed pillars are removed, method 300 proceeds to block 312, in which a memristor element is applied to the intermediate electrode. This memristor element may be composed of hafnium oxide or other metal oxide with insulative properties. As a result of these insulative properties, current may not conduct through the memristor element when a conductive filament is formed through the memristor. Further, because this memristor element should have a concave, closed-curve profile that is similar to the profile of the intermediate electrode, it should also have at least one narrow point near a narrow point on the intermediate electrode. This may cause the conductive filament to be far more likely to form in the narrow point.

In some embodiments, block 312 may also include applying an insulating layer to the ReRAM module prior to applying the memristor element. This may prevent potential shorts between the source electrode (on which the intermediate electrode is formed) and the memristor element. In other words, the insulating layer may prevent any current from the source electrode from flowing to the memristor element except through the intermediate electrode.

Once the memristor element is applied to the intermediate electrode in block 312, method 300 proceeds to block 314 in which a sink electrode is applied to the memristor element. This causes memristor element to be electrically between the intermediate electrode and the sink electrode. Because current from the source electrode should flow to the memristor element through the intermediate electrode, this also should result in a voltage applied across the source electrode and the sink electrode to create a current through the memristor element. If this current is sufficiently large (i.e., if the voltage across the source electrode and the sink electrode is sufficiently high), a conductive filament may then form across the memristor element.

In some embodiments, block 314 may include recessing the memristor element and intermediate electrode. This would cause the sink electrode to be slightly taller (with respect to the bottom of the ReRAM module) than both the memristor element and intermediate electrode. This could also enable the deposition of nitride on top of the memristor element and intermediate electrode. This nitride cap may prevent unintentional shorts between the top of the intermediate electrode and the top of the sink electrode. In other words, it may force any current between the intermediate electrode and the sink electrode to flow through a conductive filament in the memristor element.

In the embodiments disclosed in FIGS. 1A-1C and 2A-2X, intermediate electrodes with a four-point concave closed-curve profile are illustrated. However, some embodiments of the present disclosure may utilize intermediate electrodes with concave closed-curve profiles with other numbers of narrow points. As described above, the increased current at the narrow points at which the intermediate electrode, memristor element, and sink electrode interface with each other cause a conductive filament to be more likely to form at those narrow points. However, the number of narrow points is not vital to the invention.

Figure 4:
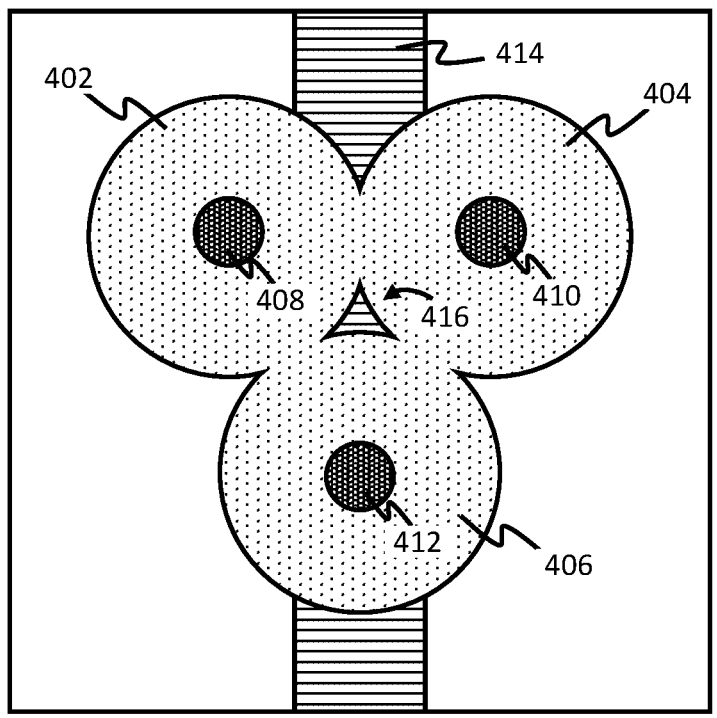
FIG. 4 depicts an example set of nitride rings that could be used in accordance with some embodiments of the present disclosure to form an intermediate electrode with a concave closed-curve profile with three points.

For example, FIG. 4 depicts a top view of an example set of nitride rings 402-406 that could be used in accordance with some embodiments of the present disclosure to form an intermediate electrode with a concave closed-curve profile with three points. In FIG. 4, a set of seed pillars 408, 410, and 412 surround a section of a source electrode 414. Nitride rings 402-406 are applied to the sidewalls of those seed pillars 408-412 such that nitride rings 402-406 partially overlap, creating a gap 416 in the center of seed pillars 408-412 and nitride rings 402-406. Because three seed pillars are used herein, gap 416 has a three-point concave closed-curve profile. If an intermediate electrode were deposited into gap 416, then, it could be formed with three narrow points.

Figure 5:
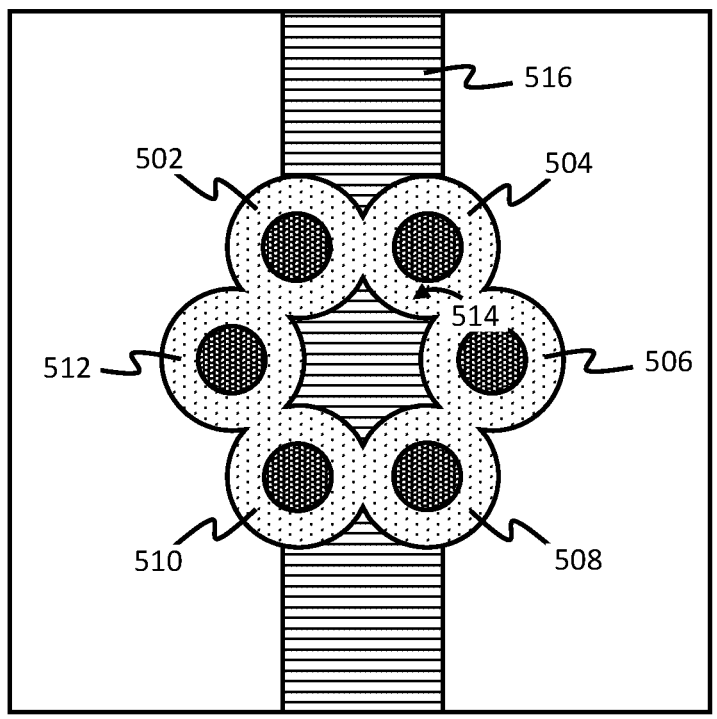
FIG. 5 depicts an example set of nitride rings that could be used in accordance with some embodiments of the present disclosure to form an intermediate electrode with a concave closed-curve profile with six points.

As another example, FIG. 5 depicts a top view of an example set of nitride rings 502-512 that could be used in accordance with some embodiments of the present disclosure to form an intermediate electrode with a concave closed-curve profile with six points. The partial overlap of nitride rings 502-512 creates a gap 514 above source electrode 516. By filling that gap with an intermediate electrode, an electrode with a six-point, concave, closed-curve profile could be formed.

Of note, FIGS. 2A-2X, 4, and 5 illustrate that embodiments of the present disclosure can include nitride borders of different thicknesses and different amounts of overlap. Further, the positions of the seed pillars in each of FIGS. 2A-2X, 4, and 5 are different, illustrating that embodiments of the present disclosure can include different positions of seed pillars and nitride borders. These properties could be altered in other embodiments to create gaps between the nitride borders of different shapes and sizes, which may be used to create intermediate electrodes of different shapes and sizes. Further, as discussed above, by altering the shapes of hardmask deposits that are used to create seed pillars, the shapes of seed pillars on which the nitride borders accumulate can be customized. This can in turn affect the accumulation of nitride on the seed pillars, which affects the shape of those nitride borders. This may be used to customize the shape of an intermediate electrode formed in a gap between those nitride borders.

Figure 6:
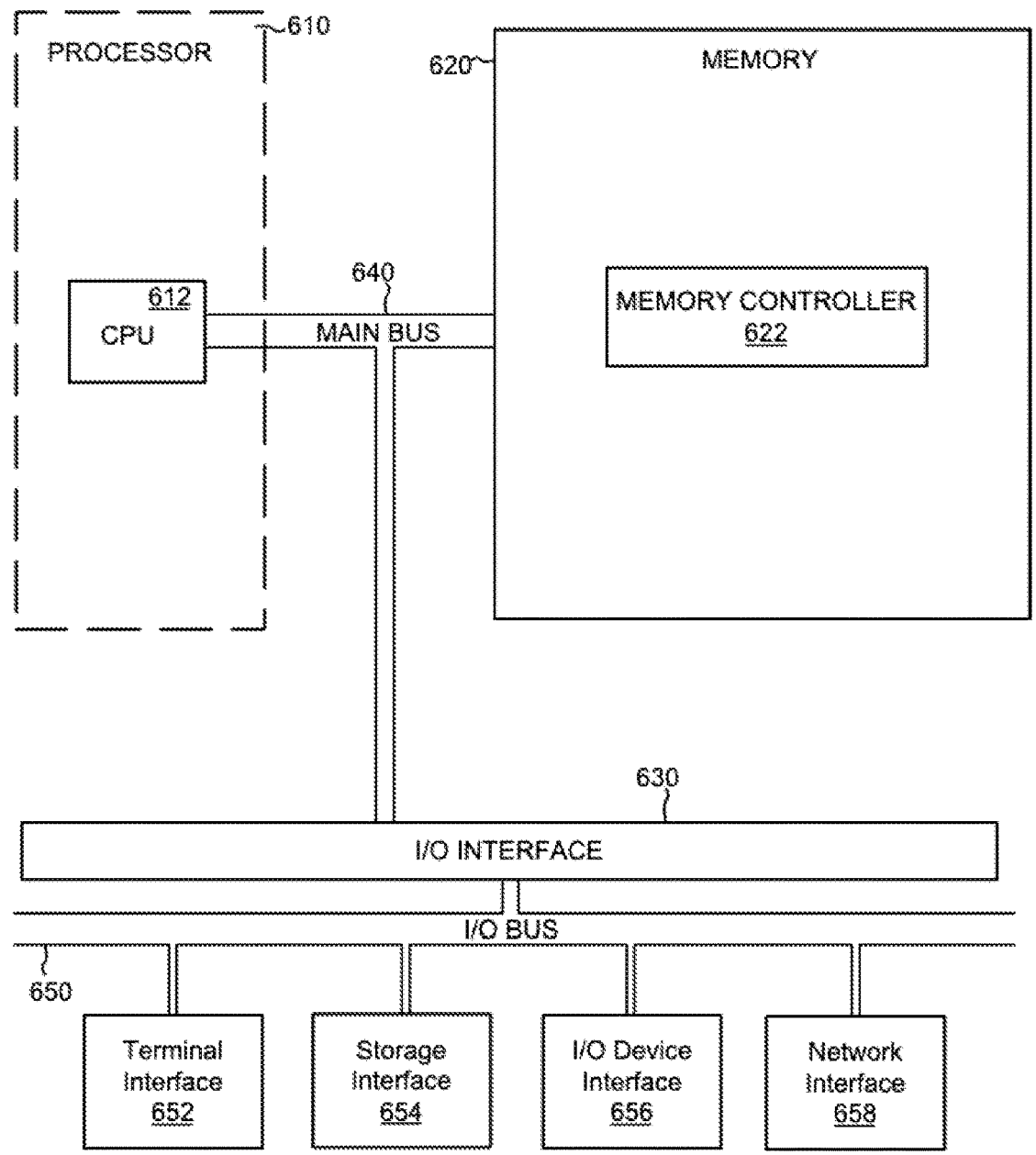
FIG. 6 depicts the representative major components of an example computer system that may be used in accordance with embodiments of the present disclosure.

FIG. 6 depicts the representative major components of an example Computer System 601 that may be used in accordance with embodiments of the present disclosure. The particular components depicted are presented for the purpose of example only and are not necessarily the only such variations. The Computer System 601 may include a Processor 610, Memory 620, an Input/Output Interface (also referred to herein as I/O or I/O Interface) 630, and a Main Bus 640. The Main Bus 640 may provide communication pathways for the other components of the Computer System 601. In some embodiments, the Main Bus 640 may connect to other components such as a specialized digital signal processor (not depicted).

The Processor 610 of the Computer System 601 may include one or more CPUs 612. The Processor 610 may additionally include one or more memory buffers or caches (not depicted) that provide temporary storage of instructions and data for the CPU 612. The CPU 612 may perform instructions on input provided from the caches or from the Memory 620 and output the result to caches or the Memory 620. The CPU 612 may include one or more circuits configured to perform one or methods consistent with embodiments of the present disclosure. In some embodiments, the Computer System 601 may contain multiple Processors 610 typical of a relatively large system. In other embodiments, however, the Computer System 601 may contain a single processor with a singular CPU 612.

The Memory 620 of the Computer System 601 may include a Memory Controller 622 and one or more memory modules for temporarily or permanently storing data (not depicted). In some embodiments, the Memory 620 may include a random-access semiconductor memory, storage device, or storage medium (either volatile or non-volatile) for storing data and programs. The Memory Controller 622 may communicate with the Processor 610, facilitating storage and retrieval of information in the memory modules. The Memory Controller 622 may communicate with the I/O Interface 630, facilitating storage and retrieval of input or output in the memory modules. In some embodiments, the memory modules may be dual in-line memory modules.

The I/O Interface 630 may include an I/O Bus 650, a Terminal Interface 652, a Storage Interface 654, an I/O Device Interface 656, and a Network Interface 658. The I/O Interface 630 may connect the Main Bus 640 to the I/O Bus 650. The I/O Interface 630 may direct instructions and data from the Processor 610 and Memory 620 to the various interfaces of the I/O Bus 650. The I/O Interface 630 may also direct instructions and data from the various interfaces of the I/O Bus 650 to the Processor 610 and Memory 620. The various interfaces may include the Terminal Interface 652, the Storage Interface 654, the I/O Device Interface 656, and the Network Interface 658. In some embodiments, the various interfaces may include a subset of the aforementioned interfaces (e.g., an embedded computer system in an industrial application may not include the Terminal Interface 652 and the Storage Interface 654).

Logic modules throughout the Computer System 601—including but not limited to the Memory 620, the Processor 610, and the I/O Interface 630—may communicate failures and changes to one or more components to a hypervisor or operating system (not depicted). The hypervisor or the operating system may allocate the various resources available in the Computer System 601 and track the location of data in Memory 620 and of processes assigned to various CPUs 612. In embodiments that combine or rearrange elements, aspects of the logic modules' capabilities may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive RAM module comprising:
   a source electrode;
   an intermediate electrode that is formed on the source electrode;
   a memristor element that is deposited on the intermediate electrode such that the intermediate electrode is electrically between the source electrode and the memristor element; and
   a sink electrode that is in contact with the memristor element such that the memristor element is electrically between the intermediate electrode and the sink electrode;
   wherein the intermediate electrode and the memristor element have a closed-curve profile with at least one point.

2. The resistive RAM module of claim 1, wherein the closed-curve profile is a concave closed-curve profile.

3. The resistive RAM module of claim 2, wherein the sink electrode forms a negative pattern of the concave closed-curve profile.

4. The resistive RAM module of claim 2, wherein the concave closed-curve profile has four points.

5. The resistive RAM module of claim 1, further comprising a nitride cap that is formed on the intermediate electrode and the memristor element.

* * * * *